United States Patent
Hong et al.

(10) Patent No.: US 10,370,589 B2
(45) Date of Patent: Aug. 6, 2019

(54) PHOSPHOR, LIGHT-EMITTING DEVICE, ILLUMINATION DEVICE AND IMAGE DISPLAY DEVICE

(71) Applicant: MITSUBISHI CHEMICAL CORPORATION, Chiyoda-ku (JP)

(72) Inventors: Byungchul Hong, Chiyoda-ku (JP); Ayuko Onozuka, Chiyoda-ku (JP)

(73) Assignee: MITSUBISHI CHEMICAL CORPORATION, Chiyoda-ku (JP)

( * ) Notice: Subject to any disclaimer, the term of this patent is extended or adjusted under 35 U.S.C. 154(b) by 0 days.

(21) Appl. No.: 16/010,652

(22) Filed: Jun. 18, 2018

(65) Prior Publication Data

US 2018/0305612 A1 Oct. 25, 2018

Related U.S. Application Data

(63) Continuation of application No. PCT/JP2016/085421, filed on Nov. 29, 2016.

(30) Foreign Application Priority Data

Dec. 18, 2015 (JP) .................................. 2015-247593
Aug. 19, 2016 (JP) .................................. 2016-161515

(51) Int. Cl.
| | | |
|---|---|---|
| *C09K 11/61* | (2006.01) | |
| *C09K 11/67* | (2006.01) | |
| *H01L 33/26* | (2010.01) | |
| *H01L 33/08* | (2010.01) | |
| *H01L 33/50* | (2010.01) | |

(52) U.S. Cl.
CPC .......... *C09K 11/676* (2013.01); *C09K 11/615* (2013.01); *H01L 33/08* (2013.01); *H01L 33/26* (2013.01); *H01L 33/50* (2013.01); *H01L 33/502* (2013.01)

(58) Field of Classification Search
CPC ............ C09K 11/0827; C09K 11/0838; C09K 11/0844; C09K 11/61; C09K 11/615; C09K 11/67; C09K 11/674; C09K 11/676; C09K 11/677; H01L 31/0248
See application file for complete search history.

(56) References Cited

U.S. PATENT DOCUMENTS

| | | |
|---|---|---|
| 2006/0169986 A1 | 8/2006 | Radkov et al. |
| 2010/0142189 A1 | 6/2010 | Hong et al. |
| 2014/0327026 A1 | 11/2014 | Murphy et al. |
| 2015/0380614 A1 | 12/2015 | Hiramatsu et al. |
| 2016/0133799 A1* | 5/2016 | Park ...................... H01L 33/502 257/98 |

FOREIGN PATENT DOCUMENTS

| | | |
|---|---|---|
| JP | 2009-528429 | 8/2009 |
| JP | 2013-014715 | 1/2013 |
| JP | 2013-060506 | 4/2013 |
| WO | WO 2009/119486 A1 | 10/2009 |
| WO | WO 2014/141851 A1 | 9/2014 |

OTHER PUBLICATIONS

International Preliminary Report on Patentability and Written Opinion dated Jun. 28, 2018 in PCT/JP2016/085421.
International Search Report dated Feb. 7, 2017 in PCT/JP2016/085421 filed Nov. 29, 2016.
Tae-Gon Kim, et al., "Effect of Alkali-Earth Metal Fluorides on Phase and Luminescence of Magnesium Germanate Phosphors," Journal of Electrochemical Society , vol. 157, No. 11, 2010, pp. J397-J400.
Takahiro Arai, et al., "Mn-activated $Na_2SiF_6$ red and yellowish-green phosphors: A comparative study," Journal of Applied Physics vol. 110, 2011, pp. 063514-1-063514-9.
Yan Kai Xu, et al., Properties of $Mn^{4+}$—Activated Hexafluorotitanate Phosphors, *Journal of the Electrochemical Society*, vol. 158, No. 3, 2011, pp. J58-J65.

* cited by examiner

*Primary Examiner* — Cheung Lee
(74) *Attorney, Agent, or Firm* — Oblon, McClelland, Maier & Neustadt, L.L.P.

(57) ABSTRACT

The present invention addresses providing a novel narrow-band red phosphor having a high internal quantum efficiency, a short afterglow time, and a large number of emission components in a short-wavelength region with high red visibility. This is solved by a phosphor characterized by including a crystalline phase that has a predetermined composition and having a specific peak in a powder X-ray diffraction pattern.

20 Claims, 8 Drawing Sheets

PHOSPHOR, LIGHT-EMITTING DEVICE, ILLUMINATION DEVICE AND IMAGE DISPLAY DEVICE

CROSS-REFERENCE TO RELATED APPLICATION

This is a continuation of International Application PCT/JP2016/085421, filed on Nov. 29, 2016, and designated the U.S., and claims priority from Japanese Patent Application 2015-247593 which was filed on Dec. 18, 2015 and Japanese Patent Application 2016-161515 which was filed on Aug. 19, 2016. The contents of these applications are incorporated herein by reference in their entirety.

TECHNICAL FIELD

The present invention relates to a phosphor, a light-emitting device, an illumination device, and an image display device.

BACKGROUND ART

Light-emitting device (hereinafter referred to as "LED" as appropriate) that emit white light by using an excitation light source emitting light in a near ultraviolet or short wavelength visible range in combination with a phosphor came into common use and have recently found practical application to image display devices and illumination devices. In particular, phosphors that emit red fluorescence (hereinafter referred to as "red phosphors" as appropriate) are used for light-emitting devices for image display devices and illumination devices, and light emission properties thereof have been improved variously. Of these, the development of a phosphor having a narrow full width at half maximum in a specific wavelength band is regarded as important in order to achieve both efficiency and color rendering property.

In order to realize both high efficiency and color rendering property of an image display device and an illumination device, for example, a red phosphor having an emission peak wavelength of an emission spectrum of 590 nm or more and 650 nm or less and a full width at half maximum of the emission spectrum of 1 nm or more and 80 nm or less can be effectively used. For this reason, the development of red phosphors having the above-mentioned emission properties has been carried out.

Non-patent document 1 discloses a $Mn^{4+}$-activated oxyfluoride phosphor such as $Mg_{28}Ge_{7.5}O_{38}F_{10}$:$Mn^{4+}$ as such a phosphor. Further, for example, Patent document 1 discloses a $Mn^{4+}$-activated fluoride phosphor such as a fluorogermanate phosphor.

CITATION LIST

Patent Literature

Patent document 1: Japanese Patent Application Laid-open No. 2009-528429

Non Patent Literature

Non-patent document 1: *Journal of the Electrochemical Society*, 157 (11) J397-J400 (2010)

SUMMARY OF INVENTION

Technical Problem

However, a problem associated with the phosphor disclosed in Non-patent document 1 is that the emission peak wavelength thereof is in a long-wavelength region around 660 nm and the red visibility is low, which results in a reduced emission brightness of the phosphor. Further, a problem associated with the phosphor disclosed in Patent document 1 is that although the full width at half maximum of the emission spectrum thereof is narrow, an afterglow time is long. When the afterglow time is long, the usage amount of the phosphor used for the light-emitting device tends to increase. Further, when displaying an image, it tends to be difficult to display an image with fast operation.

Therefore, there is a need for a phosphor having an emission peak wavelength of 590 nm or more and 650 nm or less and a narrow full width at half maximum of the emission spectrum (hereinafter referred to as "narrowband red phosphor"), such a phosphor having a high internal quantum efficiency, a short afterglow time, and a large number of light emitting components in a short-wavelength region with high red visibility.

In view of the above problems, the present invention provides a novel narrowband red phosphor having a high internal quantum efficiency, a short afterglow time, and a large number of emission components in a short-wavelength region (590 nm or more and 650 nm or less) with high red visibility. The present invention also provides a high-quality light-emitting device including the phosphor, an illumination device and an image display device.

Solution of Problem

As a result of intensive research carried out to solve the above problems, the inventors of the present invention have found that the problems can be solved by a phosphor having a specific composition and also having a peak in a specific region in a powder X-ray diffraction pattern. This finding led to the completion of the present invention. The inventors of the present invention have also found that the problems can be solved by a phosphor which has a specific composition and a specific crystal system and in which a unit lattice volume has a specific value. This finding led to the completion of the present invention. Furthermore, the inventors of the present invention have found that the problems can be solved by a phosphor which has a specific composition and does not have a peak in a specific region in a powder X-ray diffraction pattern. This finding led to the completion of the present invention. The present invention is described hereinbelow.

[1] A phosphor including a crystalline phase which has a composition represented by Formula [1] below, and having peaks in regions 1 to 5 shown below in a powder X-ray diffraction pattern measured using CuKα rays (1.5418 Å):

$$A_xD_yMn_zF_w \quad [1]$$

(in Formula [1], element A represents one or more elements selected from the group consisting of Li, Na, K, Rb, and Cs, element D represents two or more elements selected from the group consisting of Si, Ge, and Ti, and x, y, z, and w each independently are values satisfying formulas below:

$1.5 \leq x \leq 2.5$ $0.5 \leq y < 1$ $y+z=1$ $5.0 \leq w \leq 7.0$)

| | |
|---|---|
| 20.7°≤2θ≤21.0° | Region 1: |
| 26.1°≤2θ≤26.7° | Region 2: |
| 34.6°≤2θ≤35.6° | Region 3: |
| 38.3°≤2θ≤39.4° | Region 4: |
| 49.6°≤2θ≤50.7°. | Region 5: |

[2] A phosphor including a crystalline phase which has a composition represented by Formula [1] below, wherein
a crystal system of the crystalline phase is a hexagonal system and a unit cell volume calculated from a lattice constant is 344.0 Å$^3$ or more and 375.0 Å$^3$ or less:

$$A_xD_yMn_zF_w \quad [1]$$

(in Formula [1] below,
element A represents one or more elements selected from the group consisting of Li, Na, K, Rb, and Cs,
element D represents two or more elements selected from the group consisting of Si, Ge, and Ti, and
x, y, z, and w each independently are values satisfying formulas below:

1.5≤x≤2.5

0.5≤y<1 y+z=1

5.0≤w≤7.0)

[3] A phosphor including a crystalline phase which has a composition represented by Formula [1] below, wherein
a ratio ($I_N/I_{max}$) of an intensity $I_N$ of a peak present at 2θ=32° to 33° in a powder X-ray diffraction pattern and a strongest peak intensity $I_{max}$ in a powder X-ray diffraction pattern measured using CuKα rays (1.5418 Å) is 0.05 or less:

$$A_xD_yMn_zF_w \quad [1]$$

(in Formula [1] below,
element A represents one or more elements selected from the group consisting of Li, Na, K, Rb, and Cs,
element D represents two or more elements selected from the group consisting of Si, Ge, and Ti, and
x, y, z, and w each independently are values satisfying formulas below:

1.5≤x≤2.5

0.5≤y<1 y+z=1

5.0≤w≤7.0)

[4] The phosphor according to any one of [1] to [3], wherein lattice constants a and b of the crystalline phase are 8.88 Å or more and 9.19 Å or less and a lattice constant c is 5.06 Å or more and 5.12 Å or less.
[5] The phosphor according to any one of [1] to [4], wherein the element A is Na.
[6] The phosphor according to any one of [1] to [5], wherein the element D is Si and Ti.
[7] The phosphor according to any one of [1] to [6], which has an emission peak wavelength in a range of 600 nm or more and 650 nm or less when irradiated with excitation light having a wavelength of 350 nm or more and 460 nm or less.

[8] The phosphor according to any one of [1] to [7], wherein emission peak intensities under irradiation with excitation light having a wavelength of 350 nm or more and 460 nm or less satisfy Formula (1) below:

$$0.6 \leq I_{EP1}/I_{EP2} \quad (1)$$

(in Formula (1)
$I_{EP1}$ represents an emission peak intensity at 615 nm to 620 nm,
$I_{EP2}$ represents an emission peak intensity at 625 nm to 630 nm.)
[9] The phosphor according to any one of [1] to [8], wherein
where a maximum value of an excitation intensity in a wavelength region of 350 nm or more and 550 nm or less in an excitation spectrum is 1, an excitation intensity $I_G$ at a wavelength of 500 nm satisfies Formula (2) below.

$$0.400 \leq I_G \leq 0.520 \quad (2).$$

[10] A light-emitting device comprising a first light emitting body and a second light emitting body, which emits visible light under irradiation with light from the first light emitting body, wherein
the second light emitting body includes the phosphor according to any one of [1] to [9].
[11] An illumination device comprising the light-emitting device according to [10] as a light source.
[12] An image display device comprising the light-emitting device according to [10] as a light source.

Advantageous Effects of Invention

The present invention can provide a novel narrowband red phosphor having a high internal quantum efficiency, a short afterglow time, and a large number of emission components in a short-wavelength region (590 nm or more and 650 nm or less) with high red visibility. The present invention can also provide a high-quality light-emitting device including the phosphor, an illumination device and an image display device.

DESCRIPTION OF EMBODIMENTS

Figure 1:
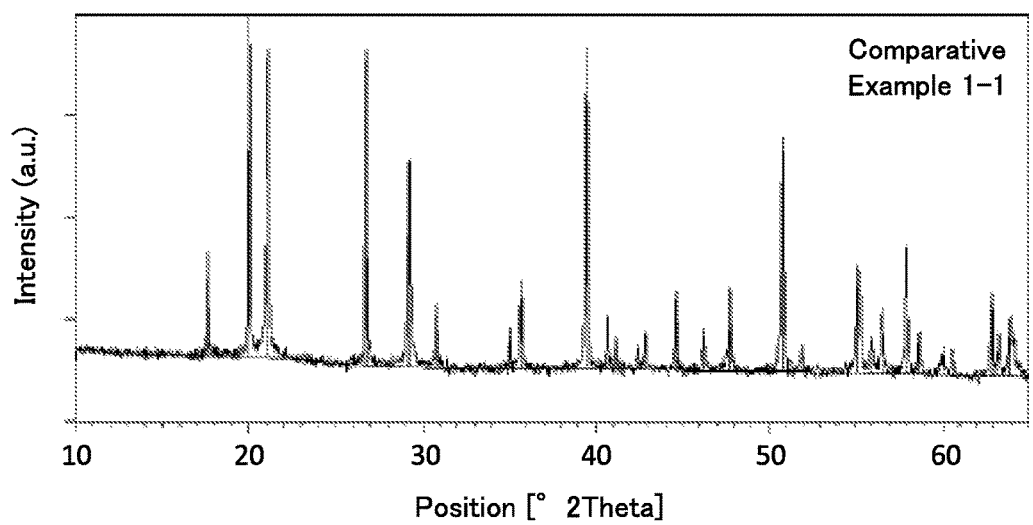
FIG. 1 is a diagram showing a powder X-ray diffraction (XRD) pattern of the phosphor obtained in Comparative Example 1-1.

Hereinafter, the present invention will be described with reference to embodiments and examples, but the present invention is not limited to the following embodiments, examples, and the like, and may be arbitrarily modified without departing from the spirit of the present invention.

In the present specification, the numerical range expressed by using "-" or "to" means a range including numerical values indicated before and after "-" or "to" as a lower limit value and an upper limit value. Further, compositional formulae of phosphors in this specification are delimited by a comma (,). When plural juxtaposed elements are delimited by commas (,), it means that one kind or two or more kinds of the juxtaposed elements can be contained in any combination and in any composition. For example, a compositional formula "(Ca, Sr, Ba)Al$_2$O$_4$:Eu" comprehensively represents all of "CaAl$_2$O$_4$:Eu", "SrAl$_2$O$_4$:Eu", "BaAl$_2$O$_4$:Eu", "Ca$_{1-x}$Sr$_x$Al$_2$O$_4$:Eu", "Sr$_{1-x}$Ba$_x$Al$_2$O$_4$:Eu", "Ca$_{1-x}$Ba$_x$Al$_2$O$_4$:Eu", and "Ca$_{1-x-y}$Sr$_x$Ba$_y$Al$_2$O$_4$:Eu" (provided that in the above formulae, 0<x<1, 0<y<1, 0<x+y<1).

In the present specification, "Mn$^{4+}$" and "tetravalent manganese" are synonymous.

The present invention includes a first invention, a second invention, and a third invention, each being inclusive of the phosphor which is the first embodiment, the light-emitting device which is the second embodiment, the illumination device which is the third embodiment, and the image display device which is the fourth embodiment.

<1. First Invention>
{Phosphor}
[Formula [1]]

A phosphor according to the first embodiment in the first invention of the present invention includes a crystalline phase which has a composition represented by Formula [1] below:

$$A_xD_yMn_zF_w \qquad [1]$$

(in Formula [1], element A represents one or more elements selected from the group consisting of Li, Na, K, Rb, and Cs, element D represents two or more elements selected from the group consisting of Si, Ge, and Ti, and x, y, z, and w each independently are values satisfying formulas below:

$1.5 \leq x \leq 2.5$ $0.5 \leq y < 1$ $y+z=1$ $5.0 \leq w \leq 7.0$).

In Formula [1], A (element A) represents one or more elements selected from the group consisting of lithium (Li), sodium (Na), potassium (K), rubidium (Rb), and cesium (Cs). Among them, from the viewpoint of obtaining a single-phase compound, rather than a mixture, and enabling homogeneous emission, it is preferable that the element A be Na.

In addition, the element A may be partially substituted with other elements within a range in which the effect of the present embodiment is not impaired. Examples of the other elements include magnesium (Mg), calcium (Ca), strontium (Sr), barium (Ba), and the like.

In Formula [1], D (element D) represents two or more elements selected from the group consisting of silicon (Si), germanium (Ge), and titanium (Ti). Among them, from the viewpoint of facilitating the activation of Mn$^{4+}$ as a light emitting ion, it is preferable that the element D be Si and Ti.

When the element D is Si and Ti, from the viewpoint of shortening the afterglow of the obtained phosphor, it is preferable that a ratio [Ti]/[Si+Ti] thereof be 0.3 or more, and more preferably 0.5 or more.

When the element D is Si and Ti, from the viewpoint of shortening the afterglow of the obtained phosphor, it is preferable that a molar ratio [Si]/[Si+Ti] thereof be 0.7 or less, more preferably 0.6 or less, and even more preferably 0.5 or less.

Meanwhile, from the viewpoint of ensuring excellent durability of the obtained phosphor, it is preferable that [Si]/[Si+Ti] be 0.3 or more, more preferably 0.4 or more, and even more preferably 0.5 or more.

Here, [Si] represents the content (mol) of Si contained in the phosphor, [Ti] represents the content (mol) of Ti contained in the phosphor, [Si+Ti] represents the total content (mol) of Si and Ti contained in the phosphor.

In the phosphor of the present embodiment, when the element D is Si and Ti, the desired characteristics such as afterglow time and durability can be adjusted by adjusting the [Si]/[Si+Ti] ratio.

In addition, the element D may be partially substituted with other elements within the range in which the effect of the present embodiment is not impaired. Examples of the other elements include tin (Sn), zirconium (Zr), hafnium (Hf), niobium (Nb), tantalum (Ta), and the like.

In Formula [1], Mn represents manganese. Mn may be partially substituted with one or more other activating elements such as europium (Eu), cerium (Ce), praseodymium (Pr), neodymium (Nd), samarium (Sm), terbium (Tb), dysprosium (Dy), holmium (Ho), erbium (Er), thulium (Tm), and ytterbium (Yb) within a range in which the effect of the present embodiment is not impaired.

When the element D is Si and Ti, from the viewpoint of increasing the emission intensity, it is preferable that [Mn]/[Si+Ti+Mn], which is the Mn analysis value, be 0.01% or more, more preferably 0.05% or more, and even more preferably 0.10% or more.

Further, when the element D is Si and Ti, from the viewpoint of increasing water resistance, it is preferable that [Mn]/[Si+Ti+Mn] be 5.0% or less, more preferably 4.5% or less, and even more preferably 4.0% or less.

Here, [Mn] represents the content (mol) of Mn contained in the phosphor, [Si] represents the content (mol) of Si contained in the phosphor, [Ti] represents the content (mol) of Ti contained in the phosphor, and [Si+Ti+Mn] represents the total content (mol) of Si, Ti and Mn contained in the phosphor.

In Formula [1], F represents fluorine. F may be partially substituted with other halogen elements, for example, chlorine (Cl), bromine (Br), and iodine (I), oxygen, and the like.

Here, x represents the content of element A, the range thereof is usually 1.5≤x≤2.5, the lower limit value is preferably 1.7, and more preferably 1.9, and the upper limit value is preferably 2.3, and more preferably 2.1.

Further, y represents the content of element D, the range thereof is usually 0.5≤y<1, the lower limit is preferably 0.7, and more preferably 0.8, and the upper limit is preferably 0.99, and more preferably 0.96. Here, z represents the content of Mn.

The interrelationship between y and z usually satisfies $y+z=1$.

Further, w represents the content of F, the range thereof is usually 5.0≤w≤7.0, the lower limit is preferably 5.5, and more preferably 5.8, and the upper limit is preferably 6.5, and more preferably 6.2.

In Formula [1], from the viewpoint of obtaining particularly good emission characteristics, it is preferable that the phosphor have a crystalline phase represented by Formula [2] below.

$$Na_x(Si,Ti)_yMn_zF_w \quad [2]$$

In Formula [2], x, y, z and w have the same meanings as those in Formula [1]. The preferred embodiments are also the same. Preferred embodiments of [Si]/[Si+Ti] are also the same as those in Formula [1]. Further, (Si, Ti) indicates Si and Ti, and the same applies to the following description.

[Powder X-Ray Diffraction (XRD) Pattern]

The phosphor of the present embodiment has peaks in regions 1 to 5 shown below in a powder X-ray diffraction pattern measured using CuKα rays (1.5418 Å)

| | |
|---|---|
| $20.7° \leq 2\theta \leq 21.0°$ | Region 1: |
| $26.1° \leq 2\theta \leq 26.7°$ | Region 2: |
| $34.6° \leq 2\theta \leq 35.6°$ | Region 3: |
| $38.3° \leq 2\theta \leq 39.4°$ | Region 4: |
| $49.6° \leq 2\theta \leq 50.7°$ | Region 5: |

Having peaks in the regions 1 to 5 in the present embodiment means that the peak top is within the range of the regions 1 to 5. The reason for specifying the regions 1 to 5 in the present embodiment is that only peaks characteristic of the phosphor of the present embodiment are selected. In the phosphor of the present embodiment, depending on the shape of the crystal, orientation occurs at the time of measurement, and peaks which can be confirmed by the X-ray diffraction pattern and peaks which cannot be confirmed may be generated, but the peaks appearing in the regions 1 to 5 in the present embodiment can be characteristically confirmed peak even in the case of orientation.

In addition, although the peak intensity may vary depending on orientation, the ratio $I/I_{max}$ of the peak intensity I in each region to the strongest peak intensity $I_{max}$ in the powder X-ray diffraction pattern of the phosphor according to the present embodiment (I is the intensity of the peaks in the regions 1 to 5. When there is a plurality of peaks in each region, the intensity of the strongest peak in each region is taken as I) is preferably 0.05 or more, more preferably 0.1 or more, and usually less than 1.

Furthermore, it is preferable that the shape of each diffraction peak not be split, that is, that a peak top be present. A single peak top means that the solid solution is a single phase. It is preferable that the solid solution be a single phase because the variation in the emission spectrum is small and there is no variation in emission even when the phosphor is used in a light-emitting device. Incidentally, when a solid solution is obtained in a single phase, there is only one value of unit lattice volume.

Further, the full width at half maximum of the peak in the region 4 is 0.50° or less, preferably 0.45° or less, and more preferably 0.400 or less.

The phosphor in which the full width at half maximum of the peak in the region 4 falls within the above range has a large smallest microcrystalline unit (crystallite) forming a crystal, that is, good crystallinity, in addition to being a solid solution. Where the crystallinity is good, the grains grow easily, and a phosphor having a large grain size is preferable because the emission brightness is high.

[Lattice Constants]

The lattice constants of the phosphor of the present embodiment vary depending on the type of elements constituting the crystal, but the lattice constants a, b, and c are each in the following ranges.

The a-axis is usually in the range of 8.88 Å or more and 9.19 Å or less, the lower limit value is preferably 8.90 Å and more preferably 8.92 Å, and the upper limit value is preferably 9.17 Å and more preferably 9.13 Å.

The b-axis is usually in the range of 8.88 Å or more and 9.19 Å or less, the lower limit value is preferably 8.90 Å and more preferably 8.92 Å, and the upper limit value is preferably 9.17 Å and more preferably 9.13 Å.

The c-axis is usually in the range of 5.06 Å or more and 5.12 Å or less, the lower limit value is preferably 5.07 Å and more preferably 5.08 Å, and the upper limit value is preferably 5.11 Å and more preferably 5.10 Å.

[Unit Cell Volume]

Where an activating element is contained, the term "phosphor" is attached as in "$Na_2(Si, Ti)F_6$ phosphor", whereas when no activating element is contained (that is, when referring to a host), the term "phosphor" is not attached as in "$Na_2(Si, Ti)F_6$".

The unit lattice volume (V) calculated from the lattice constant in the phosphor of the present embodiment is usually 344.0 Å$^3$ or more, preferably 345.3 Å$^3$ or more, and more preferably 348.5 Å$^3$ or more, and usually 375.0 Å$^3$ or less, preferably 372.8 Å$^3$ or less, and more preferably 369.6 Å$^3$ or less.

The technical meaning of the above ranges will be explained hereinbelow by taking as an example the $Na_2(Si, Ti)F_6$ phosphor of the present embodiment. The unit lattice volume of $Na_2SiF_6$ is 343.31 Å$^3$ (PDF 00-033-1280), and the unit lattice volume of $Na_2TiF_6$ is 375.94 Å$^3$ (PDF 00-043-0522). In the $Na_2SiF_6$ phosphor, the unit lattice volume increases as the proportion of substituting a part of Si with Ti increases. It is preferable that the unit lattice volume (V) be within the above range because the [Si]/[Si+Ti] ratio of the $Na_2(Si, Ti)F_6$ phosphor can be controlled to be greater than 0% and less than 100%.

The fact that there is only one value of unit cell volume means that it is a single phosphor rather than a mixture.

In the $Na_2(Si, Ti)F_6$ phosphor of the present embodiment, when a part of Si is substituted with Ti while maintaining the structure of $Na_2SiF_6$, the unit lattice volume (V) and the [Si]/[Si+Ti] ratio (p) are considered to be linearly correlated. Therefore, the Si composition can be estimated from the unit cell volume by Formula (3) below.

$$V = -0.3314 \times p + 9.1968 \quad (3)$$

That is, it is preferable that the phosphor of the present embodiment include a crystalline phase having the composition represented by Formula [1] and satisfy Formula (3).

[Crystal System and Space Group]

The space group in the phosphor of the present embodiment is not particularly limited as long as the statistically considered average structure in the range distinguishable by single-crystal X-ray diffraction shows a repetition period of the abovementioned length, but preferably belongs to No. 150 (P321) based on "International Tables for Crystallography (Third, revised edition), Volume A SPACE-GROUP SYMMETRY".

Here, the lattice constant and the space group can be obtained by a conventional method. In the case of a lattice constant, the results of X-ray diffraction and neutron diffraction can be obtained by Rietveld analysis, and a space group can be obtained by electron diffraction. The crystal system in the phosphor according to the present embodiment is a hexagonal system.

{Characteristics Etc.}
[Emission Spectrum]

The phosphor of the present embodiment preferably has the following characteristics when the emission spectrum is measured by excitation with light having a peak wavelength of 350 nm or more and 460 nm or less.

The peak wavelength λp (nm) in the above-mentioned emission spectrum is usually 590 nm or more, more preferably 600 nm or more, even more preferably 610 nm or more, and usually 650 nm or less.

These ranges are preferred because advantageous red emission is obtained.

Further, in the phosphor of the present embodiment, the full width at half maximum of the emission peak in the above-mentioned emission spectrum is usually 80 nm or less, preferably 50 nm or less, more preferably 40 nm or less, even more preferably 20 nm or less, particularly preferably 10 nm or less, and usually in the range of 1 nm or more.

It is preferable that the full width at half maximum of the emission peak in the emission spectrum be within these ranges because color purity is high and emission intensity also tends to be high.

In order to excite the abovementioned phosphor with light having a peak wavelength, for example, a xenon light source can be used. The emission spectrum of the phosphor of the present embodiment can be measured using, for example, a fluorescence spectrophotometer F-4500 or F-7000 (manufactured by Hitachi, Ltd.), or the like. The emission peak wavelength and the full width at half maximum of the emission peak can be calculated from the obtained emission spectrum.

[Formula (1)]

In the phosphor of the present embodiment, it is preferable that the emission peak intensities under irradiation with excitation light having a wavelength of 350 nm or more and 460 nm or less satisfy Formula (1) below.

$$0.6 \leq I_{EP1}/I_{EP2} \tag{1}$$

(In Formula (1), $I_{EP1}$ represents an emission peak intensity at 615 nm to 620 nm, $I_{EP2}$ represents an emission peak intensity at 625 nm to 630 nm.)

The ratio $I_{EP1}/I_{EP2}$ in the phosphor of the present embodiment is preferably 0.61 or more, more preferably 0.62 or more, usually 0.83 or less, preferably 0.80 or less, more preferably 0.79 or less, and even more preferably 0.78 or less.

The abovementioned ranges are preferable because the brightness of the phosphor of the present embodiment increases and when the phosphor is used in a light-emitting device or the like, the amount used can be reduced.

When a plurality of emission peaks exists at a wavelength of 615 nm to 620 nm, the intensity of the strongest peak among them is set as $I_{EP1}$. Likewise, when a plurality of emission peaks exists at a wavelength of 625 nm to 630 nm, the intensity of the strongest peak among them is set as $I_{EP2}$.

The technical meaning of Formula (1) will be explained hereinbelow by taking as an example the $Na_2(Si, Ti)F_6$ phosphor of the present embodiment.

In the $Na_2SiF_6$ phosphor, the value of $I_{EP1}$ increases as the proportion of substituting a part of Si with Ti increases. That is, where the value of Formula (1) is satisfied in a phosphor, it means that two kinds of elements of Si and Ti are contained in one crystalline phase. More technically, it means that $Na_2SiF_6$ and $Na_2TiF_6$ are in the form of a solid solution rather than a mixture.

Where $Na_2SiF_6$ and $Na_2TiF_6$ are a mixture, the emission spectrum varies depending on the powder. As a result, the emission spectrum of the light-emitting device tends to vary significantly. The phosphor according to the present embodiment being not a mixture is preferable because there is no variation in the emission spectrum, so that the variation in light emission of the light-emitting device is small.

[Excitation Spectrum]

The phosphor of the present embodiment has an excitation peak usually in the range of 350 nm or more, preferably 440 nm or more, more preferably 450 nm or more, and usually 500 nm or less, preferably 490 nm or less, more preferably 480 nm or less, even more preferably 470 nm or less, particularly preferably 465 nm or less, and most preferably 460 nm or less. That is, the phosphor of the present embodiment is excited by light in the near ultraviolet to blue region.

[Formula (2)]

Further, when the maximum value of the excitation intensity in the wavelength region of 350 nm or more and 550 nm or less in the excitation spectrum is taken as 1, it is preferable that there be an excitation wavelength having the maximum value of the excitation intensity in the wavelength region of 350 nm or more and less than 550 nm and that the excitation intensity $I_G$ at a wavelength of 500 nm satisfy Formula (2) below.

$$0.400 \leq I_G \leq 0.520 \tag{2}$$

The $I_G$ of the phosphor of the present embodiment is preferably 0.420 or more, and more preferably 0.440 or more, and preferably 0.500 or less, and more preferably 0.490 or less.

The abovementioned ranges are preferable because the phosphor of the present embodiment can be excited efficiently with light in the near ultraviolet to blue region, and when the phosphor is used in a light-emitting device or the like, the emission efficiency is high.

[Afterglow Time]

Once the phosphor of the present embodiment is irradiated with excitation light having a wavelength of 455 nm and the intensity change (afterglow time) of the emission peak in a wavelength range of 620 nm to 635 nm after the irradiation is stopped is measured, it is preferable that the phosphor have the following feature. Here, the time until the intensity becomes 1/10 when the initial intensity is taken as 1 is defined as afterglow time.

The afterglow time is preferably 12.5 ms or less, more preferably 12 ms or less, even more preferably 11.5 ms or less, and particularly preferably 11.0 ms or less. Further, since a short afterglow time is preferred, the lower limit is not particularly set, but it is usually a value larger than 0 ms.

The above-mentioned ranges are preferable because when a light-emitting device including the phosphor of the present embodiment is used in an image display device or the like, even an image with fast operation can be displayed satisfactorily.

[Quantum Efficiency, Absorption Efficiency]

The external quantum efficiency (11) of the phosphor of the present embodiment is preferably 40% or more, more preferably 45% or more, even more preferably 50% or more. A higher external quantum efficiency is preferable because the emission efficiency of the phosphor increases.

The internal quantum efficiency ($\eta_i$) of the phosphor of the present embodiment is preferably 82% or more, more preferably 85% or more, and even more preferably 90% or more. The internal quantum efficiency means the ratio of the number of photons emitted to the number of photons of the excitation light absorbed by the phosphor. Therefore, a higher internal quantum efficiency is preferable because the emission efficiency and the emission intensity of the phosphor is increased.

The absorption efficiency of the phosphor of the present embodiment is preferably 50% or more, more preferably 60% or more, and even more preferably 65% or more. It is preferable that the absorption efficiency be within these ranges because the emission efficiency of the phosphor is increased.

[Reflectance]

The reflectance of the phosphor of the present embodiment at a wavelength of 460 nm is preferably 40% or less, more preferably 37% or less, and even more preferably 35% or less. The reflectance at a wavelength of 700 nm is preferably 85% or more, more preferably 87% or more, and even more preferably 90% or more. A lower reflectance at a wavelength of 460 nm is preferable because it means a higher absorption rate of the excitation, and a higher reflectance at the wavelength of 700 nm is preferable because it means that there is no extra light absorption that does not contribute to excitation.

{Production Method of Phosphor}

The phosphor of the present embodiment can be produced by dissolving each phosphor raw material in hydrofluoric acid (hereinafter sometimes referred to as "HF acid") so that the composition of Formula [1] is obtained, and mixing the resulting phosphor raw material solution in HF.

Metal compounds, metals or the like are used as the phosphor raw materials. For example, when producing a phosphor having the composition represented by Formula [1], a necessary combination of the raw material of the element A (hereinafter appropriately referred to as "A source"), the raw material of the element D (hereinafter appropriately referred to as "D source"), the raw material of the Mn element (hereinafter appropriately referred to as "Mn source"), and the raw material of the F element (hereinafter appropriately referred to as "F source") is dissolved in HF acid (dissolution step), the obtained raw material solution is mixed and reacted in HF acid to generate phosphor-containing slurry (precipitation step), and if necessary, the resulting phosphor-containing slurry is heated (heat treatment step), washed (washing step), or dispersed and classified (dispersion and classification step).

In particular, one of the technical ideas for production relating to the phosphor of the present embodiment is that Si, Ge, and Ti contained as the element D in the precipitation step described later are precipitated simultaneously as $Na_2SiF_6$, $Na_2TiF_6$, and $Na_2GeF_6$. For example, when the element D is Si and Ti, by simultaneously precipitating $Na_2SiF_6$ and $Na_2TiF_6$, it is possible to obtain a $Na_2(Si, Ti)F_6$ in which Si and Ti are uniformly mixed in the crystal lattice. In this case, the ratio of the precipitation amounts of $Na_2SiF_6$ and $Na_2TiF_6$ is the Si/Ti composition of the solid solution. $Na_2SiF_6$, $Na_2TiF_6$, and $Na_2GeF_6$ can be simultaneously precipitated, for example, by a method of selecting a combination of components having close solubilities to HF acid. With a method of adjusting the timing of precipitation to the same time by the concentration of the raw material, simultaneous precipitation can be achieved even when a combination of components with different solubilities is selected.

Hereinafter, an example of a method for producing the phosphor of the present embodiment is described, but the present embodiment is not limited thereto.

[Phosphor Raw Materials]

Known materials can be used as the phosphor raw materials for use in the production of the phosphor of the present embodiment.

Specific examples of the Na source in the A source include NaF, $NaHF_2$, and the like.

Specific examples of the Li source, K source, Rb source, and Cs source include compounds in which Na in each of the compounds listed as specific examples of the Na source is replaced by Li, K, Rb, and Cs.

Specific examples of the Si source in the D source include hexafluorosilicic acid ($H_2SiF_6$), sodium hexafluorosilicate ($Na_2SiF_6$), silicon oxide ($SiO_2$), silicon (Si), and the like.

Specific examples of raw materials for the Ge source and the Ti source include compounds in which Si in each of the compounds listed as specific examples of the Si source is replaced by Ge, Ti, and the like.

Examples of the Mn source include potassium permanganate ($KMnO_4$), potassium hexachloromanganate ($K_2MnCl_6$), potassium hexafluoromanganate ($K_2MnF_6$), $NaMnO_4$ and hydrates thereof, $Na_2MnCl_6$, sodium hexafluoromanganate ($Na_2MnF_6$), and the like. Among these, potassium hexafluoromanganate ($K_2MnF_6$) and sodium hexafluoromanganate ($Na_2MnF_6$) are preferable.

Specific examples of raw materials for other activating elements such as an Eu source and a Ce source include compounds including Eu or Ce, such as chlorides, fluorides, oxides, hydroxides, carbonates, acetates, nitrates, sulfates, and the like.

Specific examples of the F source include HF acid, fluorine ($F_2$), and the like.

Furthermore, compounds which can become fluorides after dissolution of these carbonates, oxides, oxalates, metals, chlorides, and the like in HF acid can also be used as raw materials.

The F source (fluorine) in Formula [1] may be supplied from the A source, D source, and Mn source, or may be supplied from the HF acid as the reaction solution. In addition, each raw material may include unavoidable impurities.

[Dissolution Step]

In the production of the phosphor of the present embodiment, phosphor raw materials are sufficiently dissolved in HF acid by using a stirrer or the like in a combination necessary to obtain a target composition, thereby obtaining a phosphor raw material solution (dissolution step).

The concentration of the HF acid to be used for dissolving the raw materials may be appropriately designed as a concentration at which the raw materials can be dissolved and the fluorides can be formed after the raw materials are dissolved. A higher HF acid concentration is preferred because the possibility of the formation of compounds other than fluorides, such as hydroxides and the like, increases when the HF acid concentration is low. However, from the viewpoint of handling the HF acid, the concentration of HF acid is preferably about 40% to 55%.

[Precipitation Step]

In the production of the phosphor of the present embodiment, the resultant raw material solution is mixed and reacted in HF acid to generate a phosphor-containing slurry (precipitation step).

The reaction may be carried out by any method for generating a phosphor-containing slurry by mixing and reacting the raw material solution, provided that a phosphor-containing slurry is generated by reaction after mixing, examples of the methods including a method by which a phosphor-containing slurry is generated by mixing and reacting a raw material solution composed of HF and a Na source, a raw material solution composed of HF, a Si source and a Ti source, and a raw material solution composed of HF acid and a Mn source in a 45% HF acid solution; a method by which a phosphor-containing slurry is generated by mixing and reacting a raw material solution composed of HF acid, a Na source, and a Mn source with a raw material solution composed of HF acid, a Na source, a Si source, and a Ti source, or a reverse addition method thereof; and a method by which a phosphor-containing slurry is generated by mixing and reacting a raw material solution composed of HF acid, a Si source, and a Ti source with a raw material solution composed of HF acid, a Na source, and a Mn source, or a reverse addition method thereof.

In order to obtain the phosphor of the present embodiment, according to the abovementioned technical idea, it is preferable to simultaneously precipitate two or more kinds of elements contained as the element D.

The HF acid to be used for mixing the raw material reaction liquids and generating the phosphor-containing slurry can be used in any concentration, provided that the raw material solution can react and the precipitate obtained after the reaction can become a fluoride. A higher HF acid concentration is preferred because the possibility of the formation of compounds other than fluorides, such as hydroxides and the like, increases when the HF acid concentration is low. However, from the viewpoint of handling the HF acid and also because a high HF acid concentration increases the solubility of the phosphor in the HF acid and reduces the yield, it is preferable that the concentration of HF acid be about 30% to 55%.

When a plurality of raw material solutions is mixed, the remaining raw material solutions may be added to one of the raw material solutions at a high rate of 40 ml/min or more, or at a low rate of 5 ml/min or less by using a funnel or a pump. The speed of stirring one of the raw material solutions is not particularly limited as long as the stirring is performed at an appropriate speed at which no substance precipitates on the bottom of the reaction vessel and the concavity in the center of the liquid surface generated by stirring does not reach the bottom of the vessel.

[Heat Treatment Step]

In order to further homogenize the phosphor-containing slurry, the phosphor-containing slurry may be placed in a Teflon container, sealed, and then heated at a predetermined temperature. The container to be used is not limited to Teflon as long as the container is resistant to HF acid and has heat resistance at a predetermined temperature. Since the internal pressure of the sealed Teflon container increases as the temperature increases, the Teflon container may be surrounded by a SUS vessel to ensure pressure resistance.

To enable further homogenization, the phosphor slurry may be stirred with a stirring bar, or the entire heat treatment container may be rotated during the heat treatment step.

When the heat treatment temperature is too low, the homogenization does not proceed sufficiently, whereas when the heat treatment temperature is too high, the valence of the Mn ion as the emitting ion tends to change and the emission characteristics tend to deteriorate. Therefore, the preferable heat treatment temperature is in the range of 40° C. to 200° C.

During the heat treatment step, hydrochloric acid, nitric acid, sulfuric acid, phosphoric acid, and the like may be added, as necessary, to the phosphor slurry solution, in addition to HF acid.

[Washing Step]

It is preferable to include a step (washing step) of washing the precipitated phosphor after the phosphorus slurry has been generated and before the phosphor is filtered and separated.

Impurities or unreacted raw materials, mainly unreacted residues, such as HF acid, or a Na source, a Si source, a Ti source, and a Mn source, which have been used when synthesizing the phosphor of the present embodiment, or fluorides generated when dissolving in the HF acid tend to remain in the phosphor, and reaction byproducts and the like tend to be generated in the phosphor slurry.

In order to improve the properties, it is necessary to remove residues of raw materials and impurities generated during dissolution as much as possible. In the present embodiment, the washing method is not particularly limited as long as the impurities can be removed. For example, washing can be carried out with any liquid, provided that the generated phosphor does not become a compound other than fluoride, such as hydroxide, examples of suitable liquid including HF acid, a mixture of HF acid and potassium hydrogen fluoride, a mixture of hexafluorosilicic acid and HF acid, and the like.

Considering the removal of unreacted Mn, Si, Ti, and Na, washing may be performed using a solution including HF acid. A higher HF acid concentration is preferred because the possibility of the formation of compounds other than fluorides, such as hydroxides and the like, increases when the HF acid concentration is low. However, from the viewpoint of handling the HF acid and also because a high HF acid concentration increases the solubility of the phosphor in the HF acid and reduces the yield, it is preferable that the concentration of HF acid be about 40% to 50%.

The weight of the HF acid when washing the phosphor is usually 0.1 times or more, preferably 3 times or more, and more preferably 5 times or more, and usually 100 times or less, and preferably 50 times or less, of the weight of the phosphor.

The time for immersing the phosphor in the HF acid varies depending on stirring conditions and the like, but is usually 10 min or more, and preferably 1 h or more, and is usually 24 h or less, and preferably 12 h or less. Further, washing may be performed a plurality of times by using HF acid, and the kind and concentration of the liquid to be used for washing may be changed.

The phosphor can be produced by immersing the phosphor in a washing solution including HF acid and washing in the washing step, followed by filtration and drying. Also, washing with ethanol, acetone, methanol or the like may be performed at an intermediate stage.

<2. Second Invention>

The first embodiment in the second invention of the present invention is described hereinbelow.

A phosphor including a crystalline phase which has a composition represented by Formula [1] below, wherein a crystal system of the crystalline phase is a hexagonal system and a unit cell volume calculated from a lattice constant is 344.0 Å$^3$ or more and 375.0 Å$^3$ or less.

$$A_x D_y Mn_z F_w \quad [1]$$

(In Formula [1], the element A represents one or more elements selected from the group consisting of Li, Na, K, Rb, and Cs, the element D represents two or more elements selected from the group consisting of Si, Ge, and Ti, further, x, y, z, and w each independently are values satisfying formulas below.

$1.5 \leq x \leq 2.5$ $0.5 \leq y < 1$ $y+z=1$ $5.0 \leq w \leq 7.0$)

Other matters in the present embodiment are the same as explained in reference to the first embodiment in the first invention of the present invention described hereinabove. The first embodiment in the first invention of the present invention described hereinabove is also a preferred embodiment of the first embodiment in the second invention of the present invention.

<3. Third Invention>

The first embodiment in the third invention of the present invention is described hereinbelow.

A phosphor including a crystalline phase which has a composition represented by Formula [1] below, wherein a ratio ($I_N/I_{max}$) of an intensity $I_N$ of a peak present at 2θ=32° to 33° in a powder X-ray diffraction pattern and a strongest peak intensity $I_{max}$ in a powder X-ray diffraction pattern measured using CuKα rays (1.5418 Å) is 0.05 or less.

$$A_xD_yMn_zF_w \quad [1]$$

(In Formula [1], the element A represents one or more elements selected from the group consisting of Li, Na, K, Rb, and Cs, the element D represents two or more elements selected from the group consisting of Si, Ge, and Ti, further, x, y, z, and w each independently are values satisfying formulas below.

$1.5 \leq x \leq 2.5$ $0.5 \leq y < 1$ $y+z=1$ $5.0 \leq w \leq 7.0$)

Other matters in the present embodiment are the same as explained in reference to the first embodiment in the first invention of the present invention described hereinabove. The first embodiment in the first invention of the present invention described hereinabove is also a preferred embodiment of the first embodiment in the third invention of the present invention.

<Contents Common to First Invention, Second Invention, and Third Invention>

Described hereinbelow are the contents common to the first invention, the second invention, and the third invention.

Hereinafter, the first invention, the second invention, and the third invention are collectively referred to as "the present invention" including these inventions. That is, for example, the contents referred to as "the second embodiment of the present invention" is the contents common to "the second embodiment in the first invention of the present invention", "the second embodiment in the second invention of the present invention", and "the second embodiment in the third invention of the present invention". This also applies to other embodiments.

Further, for example, the light-emitting device according to the second embodiment in the first invention can include the phosphor according to the first embodiment in the first invention and/or the phosphor according to the first embodiment in the second invention and/or the phosphor according to the first embodiment in the third invention. This also applies to the light-emitting device according to the second invention and the second embodiment in the third invention.

The above is likewise applied to other embodiments in the first invention, and is likewise applied to the other embodiments in the second invention and the third invention.

{Phosphor-Containing Composition}

The phosphor according to the first embodiment of the present invention can also be used by being mixed with a liquid medium. In particular, when the phosphor according to the first embodiment of the present invention is used for a light-emitting device or the like, the phosphor is preferably used in the form of being dispersed in a liquid medium. A composition in which the phosphor according to the first embodiment of the present invention is dispersed in a liquid medium is appropriately referred to as "phosphor-containing composition according to one embodiment of the present invention" or the like as one embodiment of the present invention.

[Phosphor]

There is no limitation on the type of the phosphor according to the first embodiment of the present invention to be contained in the phosphor-containing composition of the present embodiment, and a phosphor can be arbitrarily selected from the above-mentioned phosphors. The phosphor according to the first embodiment of the present invention to be contained in the phosphor-containing composition of the present embodiment may be used singly or in an arbitrary combination and at an arbitrary ratio of two or more thereof. Furthermore, the phosphor-containing composition of the present embodiment may include a phosphor other than the phosphor according to the first embodiment of the present invention as long as the effects of the present embodiment are not significantly impaired.

[Liquid Medium]

The liquid medium used in the phosphor-containing composition of the present embodiment is not particularly limited as long as the performance of the phosphor is not impaired within a target range. Thus, it is possible to use an arbitrary inorganic material and/or organic material as long as the material exhibits a liquid property under desired use conditions, advantageously disperses the phosphor according to the first embodiment of the present invention and does not cause an undesirable reaction. Examples of suitable materials include a silicone resin, an epoxy resin, a polyimide silicone resin, and the like.

[Content of Liquid Medium and Phosphor]

The content of the phosphor and the liquid medium in the phosphor-containing composition of the present embodiment is arbitrary as long as the effects of the present embodiment are not significantly impaired, but the content of the liquid medium in the entire phosphor-containing composition of the present embodiment is usually 50% by weight or more, and preferably 75% by weight or more, and usually 99% by weight or less, and preferably 95% by weight or less.

[Other Components]

The phosphor-containing composition of the present embodiment may include other components in addition to the phosphor and the liquid medium as long as the effects of the present embodiment are not significantly impaired. Also, other components may be used singly, or two or more thereof may be used in an arbitrary combination and at an arbitrary ratio.

{Light-Emitting Device}

A light-emitting device according to the second embodiment of the present invention includes a first light emitting body (excitation light source) and a second light emitting body which emits visible light under irradiation with light from the first light emitting body, wherein the phosphor according to the first embodiment of the present invention is included as the second light emitting body. Here, any one of the phosphors according to the first embodiment of the present invention may be used singly, or two or more kinds thereof may be used in an arbitrary combination and at an arbitrary ratio thereof.

For example, a phosphor which emits fluorescence in a green region or a red region under irradiation with light from an excitation light source can be used. Specifically, in the case of constituting a light-emitting device, a phosphor having an emission peak in a wavelength range of 500 nm to 600 nm is preferable as the green or yellow phosphor, and a phosphor having an emission peak in a wavelength range of 600 nm to 660 nm, particularly preferably in a wavelength range of 610 nm to 650 nm, is preferable as the orange to red phosphor.

A light source having an emission peak in a wavelength range from 350 nm to less than 500 nm, and more preferably 460 nm or less, is used as the excitation source.

Described hereinbelow is a light-emitting device that uses the phosphor according to the first embodiment of the present invention which has an emission peak in a wavelength range of 600 nm or more and 650 nm or less and in which the first light emitting body has an emission peak in a wavelength range of 350 nm or more and less than 500 nm, more preferably 460 nm or less, but the present embodiment is not limited to such a configuration.

In the abovementioned case, the light-emitting device of the present embodiment can be, for example, in the following form (A) or (B).

(A) A form in which a phosphor having an emission peak in a wavelength range of 350 nm or more and less than 500 nm, more preferably 460 nm or less is used as the first light emitting body, and the phosphor according to the first embodiment of the present invention is used as the first phosphor of the second light emitting body.

(B) A form in which a phosphor having an emission peak in a wavelength range of 350 nm or more and less than 500 nm, more preferably 460 nm or less is used as the first light emitting body, at least one phosphor (green phosphor) having an emission peak in a wavelength range of 500 nm or more and less than 560 nm is used as the first phosphor of the second light emitting body, and the phosphor according to the first embodiment of the present invention is used as the second phosphor of the second light emitting body.

(Yellow Phosphor)

In the above forms, a yellow phosphor may be used as necessary. For example, the following yellow phosphors can be advantageously used.

For example, (Y, Gd, Lu, Tb, La)$_3$(Al, Ga)$_5$O$_{12}$:(Ce, Eu, Nd) as garnet phosphors.

For example, (Ba, Sr, Ca, Mg)$_2$SiO$_4$:(Eu, Ce), as orthosilicates.

For example, (Ba, Ca, Mg)Si$_2$O$_2$N$_2$:Eu (SION phosphors), (Li, Ca)$_2$(Si, Al)$_{12}$(O, N)$_{16}$:(Ce, Eu) (α-Sialon phosphors), (Ca, Sr)AlSi$_4$(O, N)$_7$:(Ce, Eu) (1147 phosphors), and (La, Ca, Y)$_3$(Al, Si)$_6$N$_{11}$:Ce (LSN phosphors) as (oxy) nitride phosphors.

Among the abovementioned phosphors, garnet phosphors are preferable, and among them, a YAG phosphor represented by Y$_3$Al$_5$O$_{12}$:Ce is more preferable.

LSN phosphors are also preferable, and among them, an LSN phosphor represented by La$_3$Si$_6$N$_{11}$:Ce is more preferable.

(Green Phosphor)

For example, the following phosphors can be advantageously used as green phosphors in the above form (B).

For example, (Y, Gd, Lu, Tb, La)$_3$(Al, Ga)$_5$O$_{12}$:(Ce, Eu, Nd) and Ca$_3$(Sc, Mg)$_2$Si$_3$O$_{12}$: (Ce, Eu) (CSMS phosphor) as garnet phosphors.

For example, (Ba, Sr, Ca, Mg)$_3$SiO$_{10}$: (Eu, Ce) and (Ba, Sr, Ca, Mg)$_2$SiO$_4$:(Ce, Eu) (BSS phosphor) as silicate phosphors.

For example, (Ca, Sr, Ba, Mg) (Sc, Zn)$_2$O$_4$: (Ce, Eu) (CASO phosphor) as oxide phosphors.

For example, (Ba, Sr, Ca, Mg)Si$_2$O$_2$N$_2$: (Eu, Ce), Si$_{6-z}$Al$_z$O$_z$N$_{8-z}$: (Eu, Ce) (β-Sialon phosphor) (0<z≤1), (Ba, Sr, Ca, Mg, La)$_3$(Si, Al)$_6$O$_{12}$N$_2$:(Eu, Ce) (BSON phosphor) as (oxy) nitride phosphors.

For example, (Ba, Sr, Ca, Mg)$_2$Al$_{10}$O$_{17}$: (Eu, Mn) (GBAM phosphor) as aluminate phosphors.

(Red Phosphor)

In the light-emitting device of the present embodiment, another red phosphor may be used in combination with the phosphor according to the first embodiment of the present invention. For example, the following phosphors can be advantageously used as the other red phosphors.

For example, (Sr, Ca)S:Eu (CAS phosphors) and La$_2$O$_2$S:Eu (LOS phosphor) as sulfide phosphors.

For example, (Y, Lu, Gd, Tb)$_3$Mg$_2$AlSi$_2$O$_{12}$:Ce as garnet phosphors.

For example, CdSe as nanoparticles.

For example, (Sr, Ca)AlSiN$_3$:Eu (S/CASN phosphors), (CaAlSiN$_3$)$_{1-x}$.(SiO$_2$N$_2$)$_x$:Eu (CASON phosphors), (La, Ca)$_3$(Al, Si)$_6$N$_{11}$:Eu (LSN phosphors), (Ca, Sr, Ba)$_2$Si$_5$(N, O)$_8$:Eu (258 phosphors), (Sr, Ca)Al$_{1-x}$Si$_{4-x}$O$_x$N$_{7-x}$:Eu (1147 phosphors), M$_x$(Si, Al)$_{12}$(O, N)$_{16}$:Eu (M is Ca, Sr, and the like) ((α-Sialon phosphors), Li(Sr, Ba)Al$_3$N$_4$:Eu (all x hereinabove satisfy 0<x<1), and the like as the nitride or oxynitride phosphors.

[Configuration of Light-Emitting Device]

The configuration of the light-emitting device of the present embodiment is not limited as long as the light-emitting device has a first light emitting body (excitation light source) and uses the phosphor according to the first embodiment of the present invention as a second light emitting body, and any well-known device configuration can be selected.

An embodiment of the device configuration and the light-emitting device can be exemplified by those disclosed in Japanese Patent Application Publication No. 2007-291352.

Further, the form of the light-emitting device can be exemplified by a bullet type, a cup type, a chip on board, a remote phosphor, and the like.

{Application of Light-Emitting Device}

The application of the light-emitting device of the present embodiment is not particularly limited, and the light-emitting device can be used in various fields in which ordinary light-emitting devices are used, but since the light-emitting device has a wide color reproduction range and high color rendering property, the device can be particularly advantageously used as a light source for an illumination device or an image display device.

[Illumination Device]

An illumination device according to the third embodiment of the present invention includes the light-emitting device according to the second embodiment of the present invention as a light source.

When the light-emitting device according to the second embodiment of the present invention is applied to an illumination device, the light-emitting device as described above may be appropriately incorporated and used in a well-known illumination device. The illumination device can be exemplified by a surface emitting illumination device in which a large number of light-emitting devices are arranged on the bottom surface of a holding case.

[Image Display Device]

An image display device according to the fourth embodiment of the present invention includes the light-emitting device according to the second embodiment of the present invention as a light source.

When the light-emitting device according to the second embodiment of the present invention is used as the light source of an image display device, the specific configuration of the image display device is not limited, but it is preferable that the light-emitting device be used together with a color filter. For example, in the case of a color image display device using a color liquid crystal display element as an image display device, the image display device can be formed by using the light-emitting device as a backlight and combining an optical shutter utilizing a liquid crystal with a color filter having red, green and blue pixels.

EXAMPLES

Hereinafter, the present invention will be described more specifically with reference to examples, but the present invention is not limited to the following examples and can be modified without departing from the scope thereof.

{Measuring Methods}

[Measurement of Light Emission Characteristics]

For the measurement of the emission spectrum of the phosphor, a fluorescence measuring apparatus (manufactured by JASCO Corporation) equipped with a 150 W xenon lamp as an excitation light source and a multichannel CCD detector C 7041 (manufactured by Hamamatsu Photonics K.K.) was used as a spectrum measuring apparatus. The emission peak wavelength and the full width at half maximum of the emission peak were calculated from the obtained emission spectrum.

[Composition Analysis]

With respect to silicon (Si), titanium (Ti), manganese (Mn), and sodium (Na), the composition was analyzed by adding an acid and dissolving the sample after alkali melting, appropriately diluting the obtained sample solution, and using an inductively coupled plasma emission spectrometer iCAP 7600 Duo (manufactured by Thermo Fisher Scientific Inc.).

With respect to fluorine (F), the sample was dissolved in an aqueous solution of sodium carbonate, diluted and filtered appropriately, and then measured using an ion chromatograph ICS-2000 (manufactured by Thermo Fisher Scientific Inc.).

[Powder X Ray Diffraction Measurement]

Powder X-ray diffraction was precisely measured with a powder X-ray diffractometer D8 ADVANCE ECO (manufactured by BRUKER Corp.). The measurement conditions are as follows.

CuKα tube is used
X-ray output=40 kV, 25 mA
Divergence slit=automatic
Detector=semiconductor array detector LYNXEYE, using a Cu filter
Scanning range 2θ=5 degrees to 65 degrees
Read width=0.025 degrees

[Emission Spectrum]

The emission spectrum was measured using a fluorescence spectrophotometer F-4500 (manufactured by Hitachi, Ltd.). More specifically, an emission spectrum within a wavelength range of 500 nm or more and 700 nm or less was obtained by irradiation with an excitation light having a wavelength of 455 nm at room temperature (25° C.). In addition, the emission peak wavelength (hereinafter sometimes referred to as "peak wavelength") was read from the obtained emission spectrum.

[Excitation Spectrum]

The excitation spectrum was measured using a fluorescence spectrophotometer F-4500 (manufactured by Hitachi, Ltd.). More specifically, a red emission peak was monitored at room temperature (25° C.), and an excitation spectrum within a wavelength range of 300 nm or more and 550 nm or less was obtained.

[Internal Quantum Efficiency, Absorption Efficiency]

When determining the internal quantum efficiency, firstly, a phosphor sample to be measured (for example, a phosphor powder or the like) was filled in a cell by smoothing the surface sufficiently so that measurement accuracy could be maintained, and the cell was attached to a beam-condensing unit of an integrating sphere or the like.

A Xe lamp was attached to the beam-condensing unit as a light emission source for exciting the phosphor sample. Further, adjustment was performed using a filter, a monochromator (diffraction grating spectroscope), or the like so that the emission peak wavelength of the light emission source was 455 nm monochromatic light. The phosphor sample, which was the measurement object, was irradiated with the light from the light emission source with the adjusted emission peak wavelength, and the spectrum including the emission (fluorescence) and the reflected light was measured with a spectroscopic measurement device MCPD 7000 (manufactured by Otsuka Electronics Co., Ltd.).

The internal quantum efficiency was calculated as a value obtained by dividing the number of photons derived from the fluorescence phenomenon by the number of photons absorbed by the phosphor sample.

The absorption efficiency was calculated as the value obtained by dividing the number of photons of the excitation light absorbed by the phosphor sample by the total number of photons of the excitation light.

[Measurement of Afterglow Time]

The afterglow time was measured using a fluorescence spectrophotometer F-4500 or F-7000 (manufactured by Hitachi, Ltd.). A sample was once irradiated with an excitation light having a wavelength of 455 nm at room temperature (25° C.), and the intensity change of the red emission peak after the irradiation was stopped was measured. The initial intensity was taken as 1.0, and the change in intensity up to 20 ms was measured.

[XPS Measurement]

XPS (X-ray Photoelectron Spectroscopy) measurement was carried out using an X-ray photoelectron spectrometer Quantum 2000 (manufactured by PHI, Inc.). The measurement conditions are shown below.

X-ray source: monochromated Al-Kα, output 16 kV-34 W (X-ray generation area 170 um ϕ)
Spectroscopic system: path energy
187.85 eV @ wide spectrum
93.90 eV @ narrow spectrum (C1s, Mn2p3)
58.70 eV @ narrow spectrum (O1s, Si2p, FKLL)
29.35 eV @ narrow spectrum (F1s, Na1s, Ti2p)
Measurement area: 170 um ϕ spot (<340 um ϕ)

Take-out angle: 45° (from the front side)

[Method for Measuring Reflectance]

The reflection spectrum was acquired using a 150 W xenon lamp as an excitation light source, an integrating sphere as a beam-condensing unit, and an MCPD 7000 multichannel spectrometer manufactured by Otsuka Electronics Co., Ltd. as a spectrum measuring apparatus.

First, quartz cover glass was placed on "Spectralon" (manufactured as Labsphere Inc.), which is a substance having a reflectance R of approximately 100% with respect to the excitation light (having a reflectance R of 99% with respect to the excitation light having a wavelength of 450 nm), as a standard white board, irradiation with white light of a 150 W xenon lamp was performed through an optical fiber, a reflection intensity of each wavelength was measured using a spectrum measuring apparatus in a wavelength range of 380 nm or more and 780 nm or less, and a reflection spectrum was obtained through signal processing such as sensitivity correction performed with a personal computer.

Next, the phosphor powder which was a measurement object was packed in a cell while smoothening the surface thereof enough to ensure that the measurement accuracy was maintained, then the quartz cover glass was placed thereon, the reflection intensity of each wavelength was measured by the same method, and the reflection spectrum of the sample was obtained from the ratio with the reflection intensity of the standard white board.

{Production of Phosphor}

Example 1-1

A raw material in which $H_2SiF_6$ (33% by weight), $H_2TiF_6$ (60% by weight), $K_2MnF_6$, $NaHF_2$ and hydrofluoric acid were mixed so that the charge composition ratios of the elements were Na:Si:Ti:Mn=2:0.47:0.47:0.06 was placed in a Teflon container. The Teflon container was placed in a SUS container, sealed with a SUS lid, and then heated for 16 h at 120° C. The slurry liquid after the reaction which was in the Teflon container was filtered, washed with ethanol, filtered again, and thereafter dried for 2 h at 150° C. to obtain a phosphor of Example 1-1.

Example 1-2

A phosphor of Example 1-2 was obtained in the same manner as in Example 1-1, except that the charge composition ratios of the elements were Na:Si:Ti:Mn=2:0.32:0.64:0.04.

Example 1-3

A phosphor of Example 1-3 was obtained in the same manner as in Example 1-1, except that the charge composition ratios of the elements were Na:Si:Ti:Mn=2:0.14:0.82:0.04.

Comparative Example 1-1

A phosphor was precipitated by adding $NaHF_2$ to hydrofluoric acid in which $H_2SiF_6$ and $K_2MnF_6$ were dissolved so that the charge composition ratios of the elements were Na:Si:Mn=2:0.9:0.1. The precipitated phosphor was filtered, washed, and dried in the same manner as in Example 1-1 to obtain a phosphor of Comparative Example 1-1.

Figure 2:
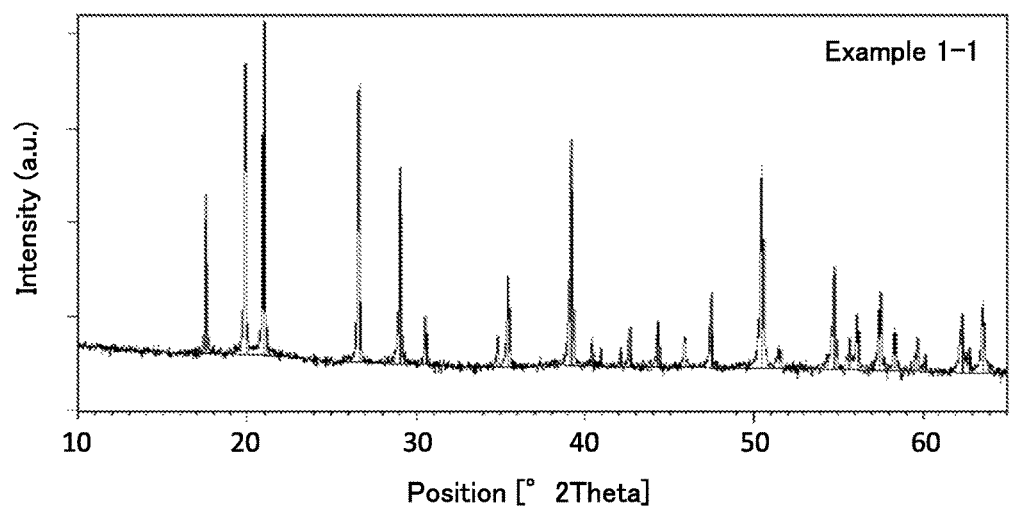
FIG. 2 is a diagram showing an XRD pattern of the phosphor obtained in Example 1-1.
Figure 3:
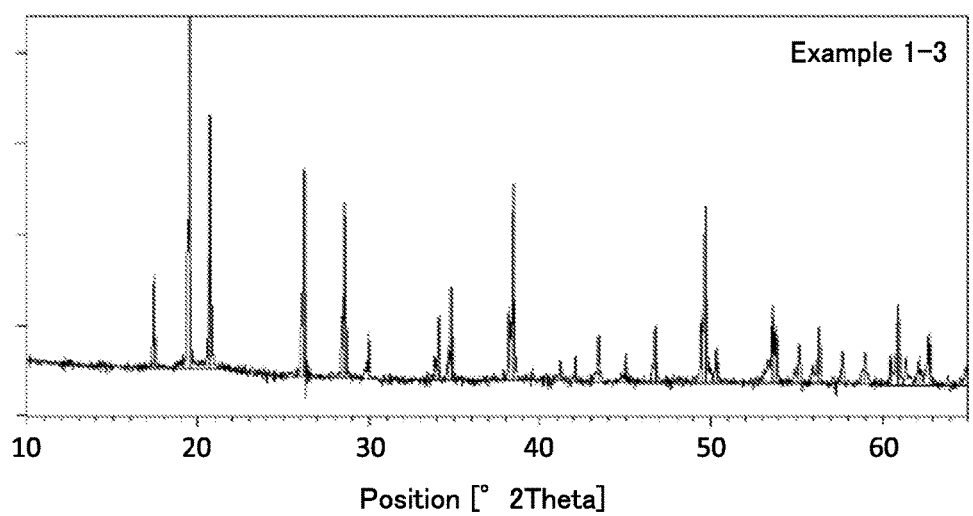
FIG. 3 is a diagram showing an XRD pattern of the phosphor obtained in Example 1-3.
Figure 4:
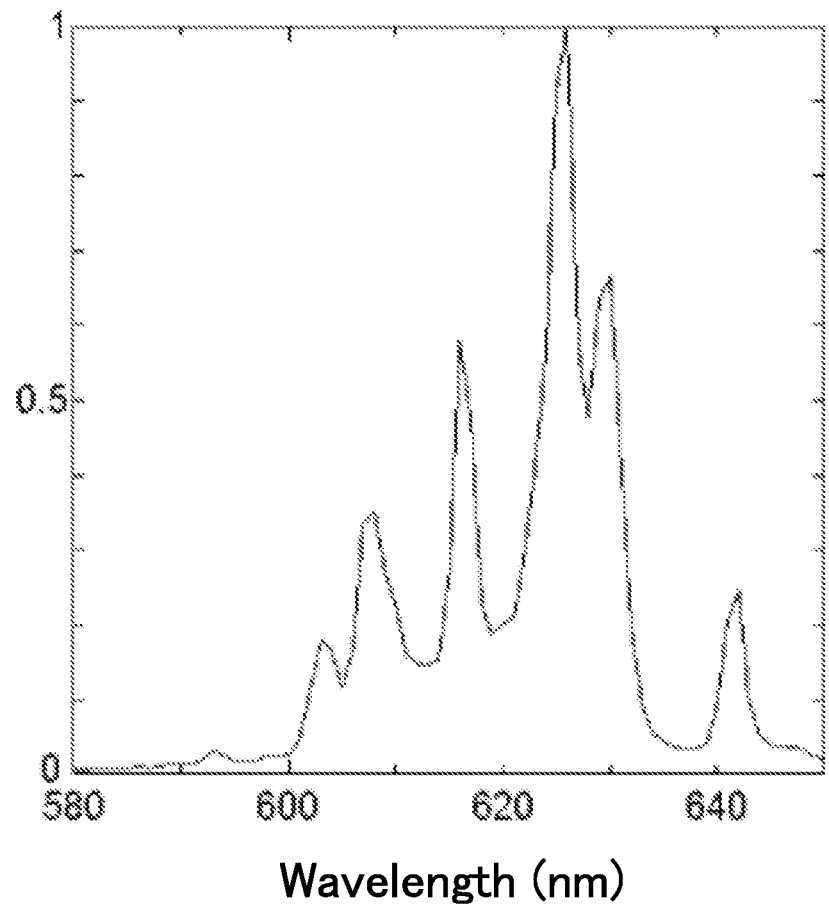
FIG. 4 is a graph showing an emission spectrum of the phosphor obtained in Comparative Example 1-1.
Figure 5:
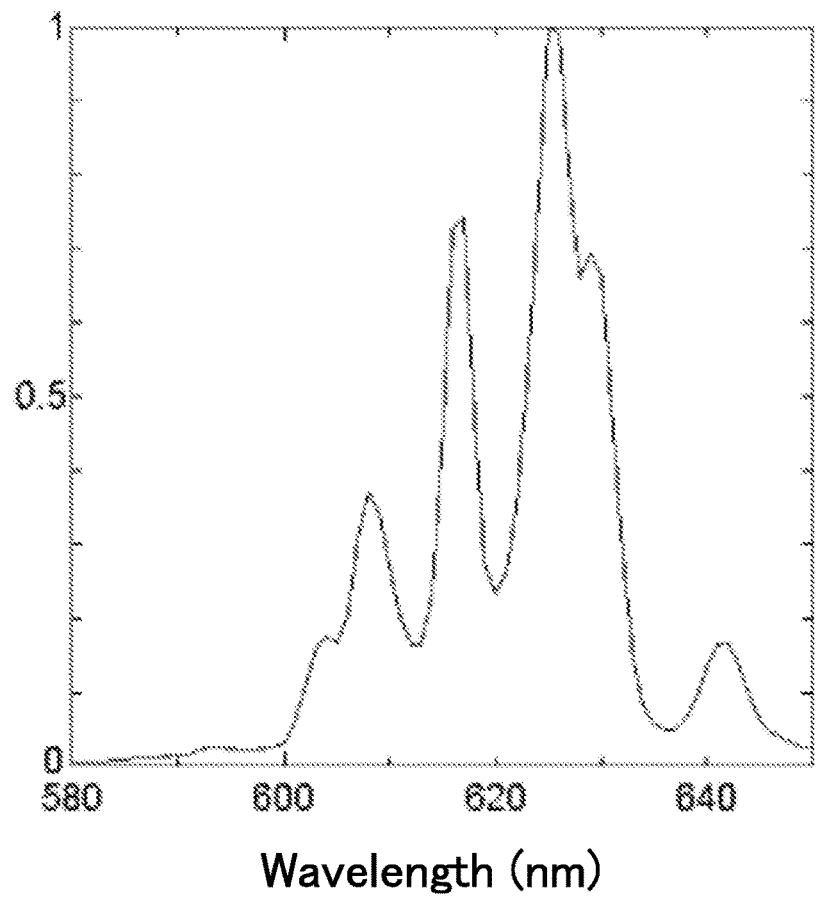
FIG. 5 is a graph showing an emission spectrum of the phosphor obtained in Example 1-3.

FIG. 1, FIG. 2, and FIG. 3 show the XRD patterns of the phosphors obtained in Comparative Example 1-1, Example 1-1, and Example 1-3, respectively. FIG. 4 and FIG. 5 show emission spectra of the phosphors obtained in Comparative Example 1-1 and Example 1-3, respectively. Further, Table 1 shows the positions (2θ) of the diffraction peaks in regions 1 to 5 in the powder X-ray diffraction patterns of the phosphor of Comparative Example 1-1 and the phosphors of Example 1-1 to Example 1-3.

TABLE 1

| | Region 1 | Region 2 | Region 3 | Region 4 | Region 5 |
|---|---|---|---|---|---|
| Comparative Example 1-1 | 21.09 | 26.78 | 35.70 | 39.48 | 50.81 |
| Example 1-1 | 20.98 | 26.62 | 35.46 | 39.21 | 50.50 |
| Example 1-2 | 20.84 | 26.41 | 35.13 | 38.84 | 50.08 |
| Example 1-3 | 20.71 | 26.21 | 34.81 | 38.47 | 49.69 |

※ Units in Table 1 are "°".

Table 2 shows the emission intensity ratio (wavelength 616 nm/wavelength 626 nm) and the afterglow time (time to 1/10 of the initial intensity) in the phosphor of Comparative Example 1-1 and phosphors of Example 1-2 and Example 1-3. A fluorescence spectrophotometer F-4500 (manufactured by Hitachi, Ltd.) was used.

TABLE 2

| | Emission intensity ratio $I_{EP}$ (616 nm)/$I_{EP}$ (626 nm) | Afterglow time (ms) (Time to 1/10 of the initial intensity) |
|---|---|---|
| Comparative Example 1-1 | 0.58 | 13.5 |
| Example 1-2 | 0.60 | 12.0 |
| Example 1-3 | 0.75 | 11.0 |

As shown in Table 2, the phosphor according to the first embodiment of the present invention has a short afterglow time. Therefore, the use amount of the phosphor according to the first embodiment of the present invention can be reduced. Furthermore, when the light-emitting device using the phosphor according to the first embodiment of the present invention is used in an image display device or the like, it is possible to display satisfactorily even an image with fast operation.

In the phosphor according to the first embodiment of the present invention, the peak intensity on the short wavelength side (616 nm) is higher. That is, since the emission in the red visible region is more increased, the phosphor according to the first embodiment of the present invention is also satisfactory in terms of emission brightness.

{Production of Phosphor}

Example 2-1

$H_2SiF_6$ (33% by weight) and $H_2TiF_6$ (60% by weight) were weighed so that [Si]/[Si+Ti]=0.17 and $K_2MnF_6$ was weighed so that [Mn]/[Si+Ti+Mn]=0.044. $H_2SiF_6$ (33% by weight) and $H_2TiF_6$ (60% by weight) were mixed together with HF acid to prepare a first solution. Next, $NaHF_2$ was added to the HF acid to a solubility limit or higher to form a slurry, and $K_2MnF_6$ was further added to prepare a second solution.

The first solution was added while stirring the second solution to obtain a phosphor-containing slurry solution. The phosphor-containing slurry solution was filtered, washed with ethanol, filtered again, and thereafter dried for 2 h at 160° C. to obtain a phosphor of Example 2-1.

From the powder XRD pattern of the phosphor of Example 2-1, the crystal system was a hexagonal system and the space group was P321. The lattice constants were a=b=9.11 Å, c=5.11 Å, and the unit cell volume was 367.3 Å$^3$.

Example 2-2

The phosphor of Example 2-2 was obtained in the same manner as in Example 2-1 except that [Si]/[Si+Ti]=0.32 and [Mn]/[Si+Ti+Mn]=0.042.
From the powder XRD pattern of the phosphor of Example 2-2, the crystal system was a hexagonal system and the space group was P321. The lattice constants were a=b=9.01 Å, c=5.09 Å, and the unit cell volume was 357.7 Å$^3$.

Example 2-3

The phosphor of Example 2-3 was obtained in the same manner as in Example 2-1 except that [Si]/[Si+Ti]=0.61 and [Mn]/[Si+Ti+Mn]=0.040.
From the powder XRD pattern of the phosphor of Example 2-3, the crystal system was a hexagonal system and the space group was P321. The lattice constants were a=b=8.94 Å, c=5.07 Å, and the unit cell volume was 351.0 Å$^3$.

Example 2-4

The phosphor of Example 2-4 was obtained in the same manner as in Example 2-1 except that [Si]/[Si+Ti]=0.16 and [Mn]/[Si+Ti+Mn]=0.022.
From the powder XRD pattern of the phosphor of Example 2-4, the crystal system was a hexagonal system and the space group was P321. The lattice constants were a=b=9.12 Å, c=5.12 Å, and the unit cell volume was 368.4 Å$^3$.

Example 2-5

The phosphor of Example 2-5 was obtained in the same manner as in Example 2-1 except that [Si]/[Si+Ti]=0.17 and [Mn]/[Si+Ti+Mn]=0.033.
From the powder XRD pattern of the phosphor of Example 2-5, the crystal system was a hexagonal system and the space group was P321. The lattice constants were a=b=9.11 Å, c=5.11 Å, and unit cell volume was 367.4 Å$^3$.

Example 2-6

The phosphor of Example 2-6 was obtained in the same manner as in Example 2-1 except that [Si]/[Si+Ti]=0.33 and [Mn]/[Si+Ti+Mn]=0.022.
From the powder XRD pattern of the phosphor of Example 2-6, the crystal system was a hexagonal system and the space group was P321. The lattice constants were a=b=9.02 Å, c=5.09 Å, and unit cell volume was 358.9 Å$^3$.

Example 2-7

The phosphor of Example 2-7 was obtained in the same manner as in Example 2-1 except that [Si]/[Si+Ti]=0.33 and [Mn]/[Si+Ti+Mn]=0.032.
From the powder XRD pattern of the phosphor of Example 2-7, the crystal system was hexagonal system and the space group was P321. The lattice constants were a=b=9.02 Å, c=5.10 Å, and the unit cell volume was 359.1 Å$^3$.

As a result of XPS measurement, the Mn concentration on the surface was 2.3 mol %.

Example 2-8

The phosphor of Example 2-8 was obtained in the same manner as in Example 2-1 except that [Si]/[Si+Ti]=0.61 and [Mn]/[Si+Ti+Mn]=0.021.
From the powder XRD pattern of the phosphor of Example 2-8, the crystal system was a hexagonal system and the space group was P321. The lattice constants were a=b=8.93 Å, c=5.07 Å, and unit cell volume was 350.1 Å$^3$.

Example 2-9

The phosphor of Example 2-9 was obtained in the same manner as in Example 2-1 except that [Si]/[Si+Ti]=0.62, [Mn]/[Si+Ti+Mn]=0.031.
From the powder XRD pattern of the phosphor of Example 2-9, the crystal system was a hexagonal system and the space group was P321. The lattice constants were a=b=8.93 Å, c=5.07 Å, and the unit cell volume was 350.2 Å$^3$.

Comparative Example 2-1

$H_2SiF_6$ (33% by weight), $H_2TiF_6$ (60% by weight), $K_2MnF_6$, and $NaHF_2$ were weighed so that the charge composition ratios of the elements were Na:Si:Ti:Mn=2:0.32:0.64:0.04, that is, [Si]/[Si+Ti]=0.33 and [Mn]/[Si+Ti+Mn]=0.04.
The first solution was prepared by adding $H_2SiF_6$ (33% by weight), $H_2TiF_6$ (60% by weight) and $K_2MnF_6$ to hydrofluoric acid.
$NaHF_2$ was added to the first solution to obtain a slurry liquid including a phosphor. The slurry liquid including a phosphor was filtered, washed with ethanol, filtered again, and thereafter dried for 2 h at 160° C. to obtain the phosphor of Comparative Example 2-1.
The Mn concentration on the surface determined by XPS measurement was 4.6 mol %.

Comparative Example 2-2

$NaHF_2$ was added to HF acid in which $H_2SiF_6$ (33% by weight) and $K_2MnF_6$ were dissolved so that the charge composition ratios of the elements were Na:Si:Mn=2:0.9:0.1, that is, [Si]/[Si+Ti]=1.00 and [Mn]/[Si+Ti+Mn]=0.10, thereby obtaining a slurry liquid including the phosphor. The slurry liquid including the phosphor was filtered, washed with ethanol, filtered again, and thereafter dried for 2 h at 160° C. to obtain the phosphor of Comparative Example 2-2.
(Comparative Example 2-3) $NaHF_2$ was added to HF acid in which $H_2TiF_6$ (60% by weight) and $K_2MnF_6$ were dissolved so that the charge composition ratios of the elements were Na:Ti:Mn=2:0.96:0.04, that is, [Si]/[Si+Ti]=0.00 and [Mn]/[Si+Ti+Mn]=0.04, thereby obtaining a slurry liquid including the phosphor. The slurry liquid including phosphor was filtered, washed with ethanol, filtered again, and thereafter dried for 2 h at 160° C. to obtain the phosphor of Comparative Example 2-3.
For Example 2-1 to Example 2-9 and Comparative Example 2-1 to Comparative Example 2-3, Table 3 shows the charge composition, lattice constants, unit cell volume, full width at half maximum of the peak in the region 4 (38.2°≤2θ≤39.50), and intensity ratio $I_N/I_{max}$ refined from the powder XRD patterns of the obtained phosphors.

TABLE 3

| Example | Charge Si/ (Si + Ti) | Charge (Mn)/ (Si + Ti + Mn) | Composition analysis value Si/(Si + Ti) | Composition analysis value (Mn)/ (Si + Ti + Mn) | Surface Mn analysis value (Mn)/ (Si + Ti + Mn) | a axis length [Å] | b axis length [Å] | c axis length [Å] | Unit lattice volume [Å 3] | Full width at half maximum in the region 4 [°] | Intensity ratio $I_N/I_{max}$ |
|---|---|---|---|---|---|---|---|---|---|---|---|
| Example 2-1 | 17% | 4.4% | 27% | 4.9% | — | 9.11 | 9.11 | 5.11 | 367.3 | 0.305 | 0.027 |
| Example 2-2 | 32% | 4.2% | 53% | 4.4% | — | 9.01 | 9.01 | 5.09 | 357.7 | 0.207 | 0.021 |
| Example 2-3 | 61% | 4.0% | 79% | 3.6% | — | 8.94 | 8.94 | 5.07 | 351.0 | 0.207 | 0.026 |
| Example 2-4 | 16% | 2.2% | — | — | — | 9.12 | 9.12 | 5.12 | 369.4 | 0.305 | 0.000 |
| Example 2-5 | 17% | 3.3% | — | — | — | 9.11 | 9.11 | 5.11 | 367.4 | 0.296 | 0.000 |
| Example 2-6 | 33% | 2.2% | — | — | — | 9.02 | 9.02 | 5.09 | 358.9 | 0.199 | 0.000 |
| Example 2-7 | 33% | 3.2% | 51% | 3.6% | 2.3% | 9.02 | 9.02 | 5.10 | 359.1 | 0.234 | 0.015 |
| Example 2-8 | 61% | 2.1% | — | — | — | 8.93 | 8.93 | 5.07 | 350.1 | 0.130 | 0.000 |
| Example 2-9 | 62% | 8.1% | — | — | — | 8.93 | 8.93 | 5.07 | 350.2 | 0.129 | 0.000 |
| Comparative Example 2-1 | 33% | 4.0% | — | — | 4.6% | — | — | — | — | 1.043 | — |
| Comparative Example 2-2 | 100% | 10.0% | — | — | — | 8.87 | 8.87 | 5.05 | 343.7 | — | 0.054 |
| Comparative Example 2-3 | 0% | 4.0% | — | — | — | 9.20 | 9.20 | 5.13 | 375.9 | — | — |

With respect to the phosphors of Example 2-1 to Example 2-9, from the full width at half maximum of the peak and the peak shape in the region 4, it is understood that a solid solution with satisfactory crystallinity and controlled [Si]/[Si+Ti] ratio is obtained.

Further, from Table 3, it is understood that the Mn content of the phosphor is about the same as the charged amount.

Furthermore, from Example 2-7, it is understood that the Mn amount on the surface of the phosphor particles of the example is lower than the charged composition, and the Mn distribution control can be performed.

Figure 6:
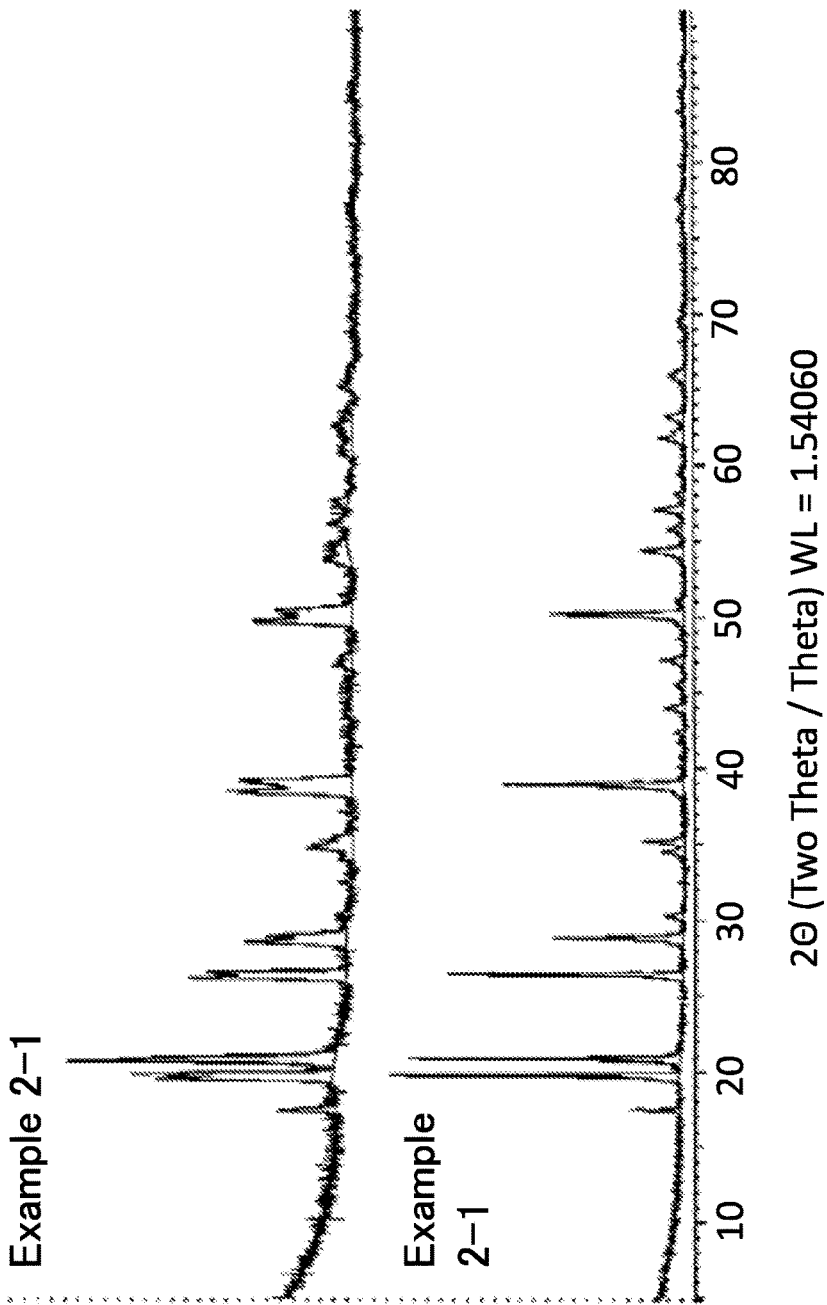
FIG. 6 is a chart showing powder XRD patterns of the phosphors obtained in Example 2-2 and Comparative Example 2-1.

FIG. 6 shows the powder XRD patterns of the phosphors of Example 2-2 and Comparative Example 2-1.

In the phosphor of Comparative Example 2-1, since the full width at half maximum of the peak in the region 4 (38.2°≤2θ≤39.5°) in the powder XRD pattern is wide and split, the mixture is composed of a $Na_2(Si, Ti)F_6$ solid solution with different molar ratios [Si]/[Si+Ti], rather than of a $Na_2(Si, Ti)F_6$ solid solution of uniform composition.

Table 4 shows the internal quantum efficiency, absorption efficiency, afterglow time, $I_{EP1}/I_{EP2}$, and $I_G$ of the phosphors obtained in Example 2-1 to Example 2-9 and Comparative Example 2-1 to Comparative Example 2-3. The afterglow time was measured using a fluorescence spectrophotometer F-7000 (manufactured by Hitachi, Ltd.).

Figure 7:
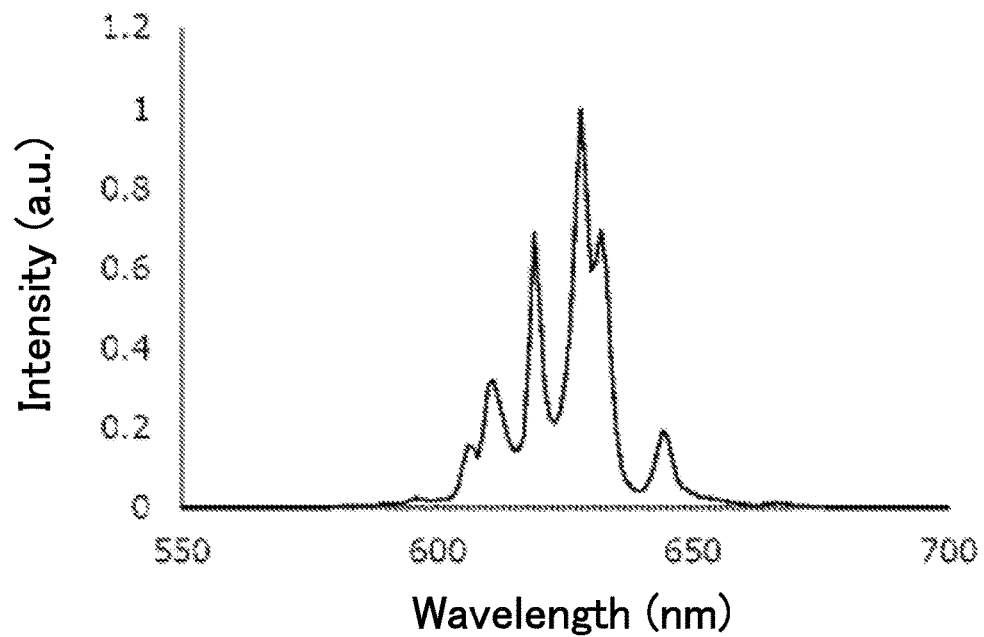
FIG. 7 is a chart showing an emission spectrum of the phosphors obtained in Example 2-2.
Figure 8:
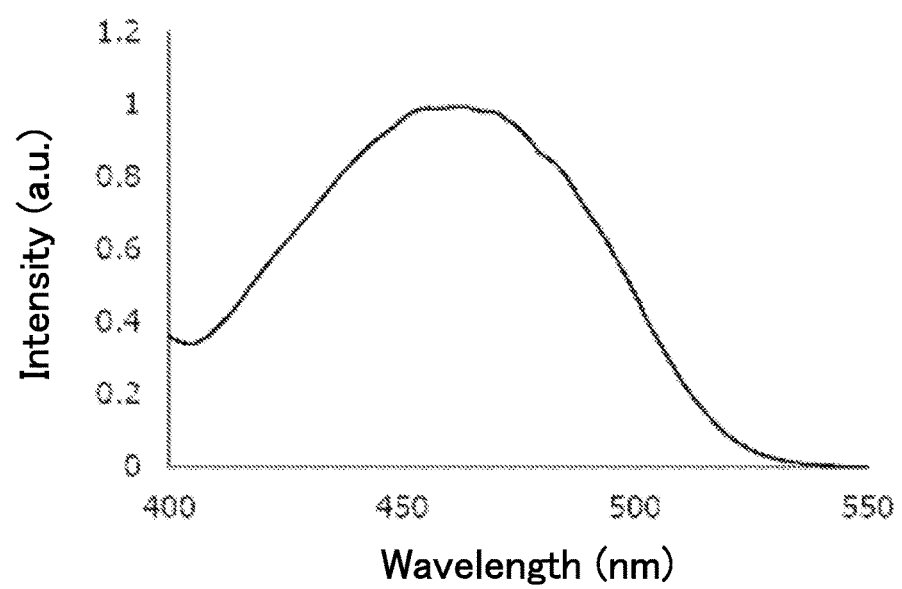
FIG. 8 is a chart showing an excitation spectrum of the phosphor obtained in Example 2-2.

Further, FIG. 7 shows a chart showing the emission spectrum of the phosphor of Example 2-2, and FIG. 8 shows a chart showing the excitation spectrum of the phosphor of Example 2-2.

TABLE 4

| Example | Internal quantum efficiency (%) | Absorption ratio (%) | Afterglow time (ms) | $I_{EP1}/I_{EP2}$ | $I_0$ |
|---|---|---|---|---|---|
| Example 2-1 | 82.8 | 74.4 | 10.9 | 0.79 | 0.513 |
| Example 2-2 | 86.7 | 69.0 | 11.7 | 0.69 | 0.484 |
| Example 2-3 | 86.1 | 68.0 | 12.7 | 0.63 | 0.444 |
| Example 2-4 | 89.8 | 59.9 | — | — | — |
| Example 2-5 | 88.6 | 69.0 | — | — | — |
| Example 2-6 | 93.0 | 54.7 | — | — | — |
| Example 2-7 | 89.1 | 64.0 | — | — | — |
| Example 2-8 | 91.5 | 64.4 | — | — | — |
| Example 2-9 | 90.6 | 54.3 | — | — | — |
| Comparative Example 2-1 | 80.3 | 65.9 | — | — | — |
| Comparative Example 2-2 | 56.9 | 61.2 | 13.0 | 0.59 | 0.349 |
| Comparative Example 2-3 | 78.8 | 73.8 | 9.7 | 0.84 | 0.521 |

Among the phosphors according to the first embodiment of the present invention, the afterglow time of the phosphor including Si and Ti as the element D is hardly affected by the Mn content and is largely dependent on the ratio of Ti to Si. More specifically, when the proportion of Ti in the element D is large, the afterglow time tends to be short, and when the proportion of Si in the element D is large, the afterglow time tends to be long. Therefore, it is considered that the phosphors obtained in Example 2-4 to Example 2-9 show similar tendencies with respect to the afterglow time.

As shown in Table 4, the phosphor according to the first embodiment of the present invention has high internal quantum efficiency and short afterglow time. Therefore, for example, a light-emitting device using the phosphor according to the first embodiment of the present invention has high emission efficiency, and when the light-emitting device is used in an image display device or the like, a high-quality image display device capable of satisfactorily displaying even images with fast operation can be obtained.

Further, the phosphor according to the first embodiment of the present invention has a large $I_{EP1}/I_{EP2}$. That is, in the phosphor according to the first embodiment of the present invention, the emission peak intensity on the short wavelength side (615 nm to 620 nm) in the emission spectrum is higher than the emission peak intensity on the long wavelength side (625 nm to 630 nm). In other words, since the emission in the red visible region is increased, the phosphor according to the first embodiment of the present invention has satisfactory emission brightness.

Further, the phosphor according to the first embodiment of the present invention has a small $I_G$. That is, in the phosphor according to the first embodiment of the present invention, the excitation intensity in the near ultraviolet to blue region having a wavelength less than 500 nm is high. Therefore, when the phosphor according to the first embodiment of the present invention is used in a light-emitting device or the like, a light-emitting device with high emission efficiency can be obtained.

Further, the phosphor prepared by the conventional technique is a mixture as in Comparative Example 2-1. Meanwhile, the phosphor according to the first embodiment of the present invention is preferable, because the variation in the emission spectrum of the phosphor generated in the case of a mixture is small, and the variation in the emission of the light-emitting device caused by the variation is small.

Furthermore, as shown in Table 5, the phosphor according to the first embodiment of the present invention has a small reflectance at a wavelength of 460 nm. That is, the phosphor according to the first embodiment of the present invention is preferable because it has a high absorption ratio of the excitation light.

TABLE 5

| | Measurement of reflectance | |
|---|---|---|
| Example | 460 nm | 700 nm |
| Example 2-1 | 34% | 89% |
| Example 2-2 | 35% | 89% |
| Example 2-3 | 39% | 91% |

[Manufacture of Light-Emitting Device]

First, a phosphor-containing composition was prepared.

A dimethylsilicone resin, fumed silica and the phosphor obtained in Examples were mixed in a stirring and defoaming apparatus to prepare a phosphor-containing composition. The quantitative ratio of the materials was adjusted so that the chromaticity of the emission spectrum indicated by the below-described light-emitting device was CIE (x, y)= (0.276, 0.263), and x and y were ±0.002.

Next, a light-emitting device was produced using the phosphor-containing composition prepared above.

The phosphor-containing composition obtained as described hereinabove was poured using a manual pipette into a 5050 size (5 mm square) ceramic package on which a 35 mil square InGaN blue LED was mounted. Thereafter, the light-emitting device was kept for 1 h at 100° C. and then for 5 h at 150° C. to cure the phosphor-containing composition and obtain a light-emitting device. The obtained light-emitting device was evaluated for durability by the lighting test described below.

[Lighting Test]

The light-emitting device was energized with a current of 350 mA, and the emission spectrum was measured with a spectrometer equipped with an integrating sphere.

Subsequently, the light-emitting device was continuously energized with a driving current of 150 mA in a thermostatic chamber set at 85° C., the light-emitting device was taken out from the thermostatic chamber at each time point of 20 h, 100 h, and 200 h from the start of energization, and the emission spectrum was measured in the same manner as at time 0.

The difference (Δx) between the chromaticity coordinate x calculated from the emission spectrum obtained after each elapsed time and the chromaticity coordinate x at time 0 was calculated, and the durability of the phosphor of Example 1 was evaluated by the value of Δx.

The results are shown in Table 6.

TABLE 6

| | | Initial brightness | Color shift Δ K | | | |
|---|---|---|---|---|---|---|
| Example | Phosphor | [Lm/W] | After 0 h | After 20 h | After 100 h | After 200 h |
| Example 3-1 | Phosphor produced in Example 2-2 | 186.2 | 0.0000 | −0.0175 | −0.0233 | −0.0260 |
| Example 3-2 | Phosphor produced in Example 2-5 | 184.0 | 0.0000 | −0.0176 | −0.0226 | −0.0257 |
| Example 3-3 | Phosphor produced in Example 2-7 | 185.2 | 0.0000 | −0.0165 | −0.0215 | −0.0246 |
| Example 3-4 | Phosphor produced in Example 2-9 | 183.7 | 0.0000 | −0.0130 | −0.0179 | −0.0209 |
| Comparative Example 3-1 | Phosphor produced in Comparative Example 2-1 | 185.5 | 0.0000 | −0.0226 | −0.0303 | −0.0335 |

As shown in Table 6, the light-emitting device including the phosphor according to the first embodiment of the present invention has small Δx. That is, the light-emitting device using the phosphor according to the first embodiment of the present invention is excellent in durability.

While the invention has been described in detail and with reference to specific embodiments, it will be apparent to a person skilled in the art that various changes and modifications can be made without departing from the spirit and scope of the invention. This application is based on a Japanese patent application (Japanese Patent Application No. 2015-247593) filed on Dec. 18, 2015 and a Japanese patent application (Japanese Patent Application No. 2016-161515) filed on Aug. 19, 2016, the contents of which are incorporated herein by reference.

The invention claimed is:

1. A phosphor including a crystalline phase which has a composition represented by Formula [1] below, and having peaks in regions 1 to 5 shown below in a powder X-ray diffraction pattern measured using CuKα rays (1.5418 Å):

$A_xD_yMn_zF_w$  [1]

(in Formula [1], element A represents one or more elements selected from the group consisting of Li, Na, K, Rb, and Cs, element D represents two or more elements selected from the group consisting of Si, Ge, and Ti, and x, y, z, and w each independently are values satisfying formulas below:

$1.5 \leq x \leq 2.5$, $0.5 \leq y < 1$, $y+z=1$, $5.0 \leq w \leq 7.0$), 20.7°≤2θ≤21.0°,   Region 1:

26.1°≤2θ≤26.7°,   Region 2:

34.6°≤2θ≤35.6°,   Region 3:

38.3°≤2θ≤39.4°, and   Region 4:

49.6°≤2θ≤50.7°.   Region 5:

2. The phosphor according to claim 1, wherein lattice constants a and b of the crystalline phase are 8.88 Å or more and 9.19 Å or less and a lattice constant c is 5.06 Å or more and 5.12 Å or less.

3. The phosphor according to claim 1, wherein the element A is Na.

4. The phosphor according to claim 1, wherein the element D is Si and Ti.

5. The phosphor according to claim 1, which has an emission peak wavelength in a range of 600 nm or more and 650 nm or less when irradiated with excitation light having a wavelength of 350 nm or more and 460 nm or less.

6. The phosphor according to claim 1, wherein emission peak intensities under irradiation with excitation light having a wavelength of 350 nm or more and 460 nm or less satisfy Formula (1) below:

$$0.6 \leq I_{EP1}/I_{EP2} \qquad (1)$$

(in Formula (1)

$I_{EP1}$ represents an emission peak intensity at 615 nm to 620 nm, $I_{EP2}$ represents an emission peak intensity at 625 nm to 630 nm).

7. The phosphor according to claim 1, wherein where a maximum value of an excitation intensity in a wavelength region of 350 nm or more and 550 nm or less in an excitation spectrum is 1, an excitation intensity $I_G$ at a wavelength of 500 nm satisfies Formula (2) below:

$$0.400 \leq I_G \leq 0.520 \qquad (2).$$

8. A light-emitting device comprising a first light emitting body and a second light emitting body, which emits visible light under irradiation with light from the first light emitting body, wherein
the second light emitting body includes the phosphor according to claim 1.

9. An illumination device comprising the light-emitting device according to claim 8 as a light source.

10. An image display device comprising the light-emitting device according to claim 8 as a light source.

11. A phosphor including a crystalline phase which has a composition represented by Formula [1] below, wherein a crystal system of the crystalline phase is a hexagonal system and a unit cell volume calculated from a lattice constant is 344.0 Å³ or more and 375.0 Å³ or less:

$$A_x D_y Mn_z F_w \qquad [1]$$

(in Formula [1],
element A represents one or more elements selected from the group consisting of Li, Na, K, Rb, and Cs,
element D represents two or more elements selected from the group consisting of Si, Ge, and Ti, and
x, y, z, and w each independently are values satisfying formulas below:

$1.5 \leq x \leq 2.5$, $0.5 \leq y < 1$, $y+z=1$, $5.0 \leq w \leq 7.0$).

12. The phosphor according to claim 11, wherein lattice constants a and b of the crystalline phase are 8.88 Å or more and 9.19 Å or less and a lattice constant c is 5.06 Å or more and 5.12 Å or less.

13. The phosphor according to claim 11, which has an emission peak wavelength in a range of 600 nm or more and 650 nm or less when irradiated with excitation light having a wavelength of 350 nm or more and 460 nm or less.

14. The phosphor according to claim 11, wherein emission peak intensities under irradiation with excitation light having a wavelength of 350 nm or more and 460 nm or less satisfy Formula (1) below:

$$0.6 \leq I_{EP1}/I_{EP2} \qquad (1)$$

(in Formula (1)

$I_{EP1}$ represents an emission peak intensity at 615 nm to 620 nm, $I_{EP2}$ represents an emission peak intensity at 625 nm to 630 nm).

15. A light-emitting device comprising a first light emitting body and a second light emitting body, which emits visible light under irradiation with light from the first light emitting body, wherein
the second light emitting body includes the phosphor according to claim 11.

16. A phosphor including a crystalline phase which has a composition represented by Formula [1] below, wherein a ratio ($I_N/I_{max}$) of an intensity $I_N$ of a peak present at 2θ=32° to 33° in a powder X-ray diffraction pattern and a strongest peak intensity $I_{max}$ in a powder X-ray diffraction pattern measured using CuKα rays (1.5418 Å) is 0.05 or less:

$$A_x D_y Mn_z F_w \qquad [1]$$

(in Formula [1],
element A represents one or more elements selected from the group consisting of Li, Na, K, Rb, and Cs,
element D represents two or more elements selected from the group consisting of Si, Ge, and Ti, and
x, y, z, and w each independently are values satisfying formulas below:

$1.5 \leq x \leq 2.5$, $0.5 \leq y < 1$, $y+z=1$, $5.0 \leq w \leq 7.0$).

17. The phosphor according to claim 16, wherein lattice constants a and b of the crystalline phase are 8.88 Å or more and 9.19 Å or less and a lattice constant c is 5.06 Å or more and 5.12 Å or less.

18. The phosphor according to claim 16, which has an emission peak wavelength in a range of 600 nm or more and 650 nm or less when irradiated with excitation light having a wavelength of 350 nm or more and 460 nm or less.

19. The phosphor according to claim 16, wherein emission peak intensities under irradiation with excitation light having a wavelength of 350 nm or more and 460 nm or less satisfy Formula (1) below:

$$0.6 \leq I_{EP1}/I_{EP2} \quad (1)$$

(in Formula (1)
$I_{EP1}$ represents an emission peak intensity at 615 nm to 620 nm,
$I_{EP2}$ represents an emission peak intensity at 625 nm to 630 nm).

20. A light-emitting device comprising a first light emitting body and a second light emitting body, which emits visible light under irradiation with light from the first light emitting body, wherein
the second light emitting body includes the phosphor according to claim 16.

\* \* \* \* \*